US011342040B2

(12) United States Patent
Yamaki et al.

(10) Patent No.: US 11,342,040 B2
(45) Date of Patent: May 24, 2022

(54) MEMORY SYSTEM

(71) Applicant: KIOXIA CORPORATION, Tokyo (JP)

(72) Inventors: Ryo Yamaki, Yokohama Kanagawa (JP); Youyang Ng, Yokohama Kanagawa (JP); Koji Horisaki, Yokohama Kanagawa (JP); Kazuhisa Horiuchi, Yokohama Kanagawa (JP); Gibeom Park, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/184,120

(22) Filed: Feb. 24, 2021

(65) Prior Publication Data

US 2021/0295942 A1 Sep. 23, 2021

(30) Foreign Application Priority Data

Mar. 23, 2020 (JP) .............................. JP2020-051262

(51) Int. Cl.
G11C 29/42 (2006.01)
G11C 29/44 (2006.01)
G11C 29/50 (2006.01)
G11C 29/18 (2006.01)

(52) U.S. Cl.
CPC .............. G11C 29/42 (2013.01); G11C 29/18 (2013.01); G11C 29/44 (2013.01); G11C 29/50004 (2013.01); G11C 2029/1802 (2013.01)

(58) Field of Classification Search
CPC .......... G11C 29/42; G11C 29/18; G11C 29/44; G11C 29/50004; G11C 2029/1802
See application file for complete search history.

(56) References Cited

U.S. PATENT DOCUMENTS

| 8,149,623 | B2 | 4/2012 | Uchikawa et al. |
| 9,069,659 | B1 | 6/2015 | Sabbag et al. |
| 9,190,159 | B2 | 11/2015 | Kurosawa |
| 2019/0279728 | A1 | 9/2019 | Kodama et al. |
| 2020/0058359 | A1* | 2/2020 | Lee ................... G11C 16/3495 |
| 2020/0285419 | A1 | 9/2020 | Ng et al. |
| 2021/0074366 | A1 | 3/2021 | Horisaki et al. |
| 2021/0202028 | A1* | 7/2021 | Choi ...................... G11C 29/44 |

* cited by examiner

Primary Examiner — Han Yang
(74) Attorney, Agent, or Firm — Kim & Stewart LLP

(57) ABSTRACT

A memory system includes a non-volatile memory having a plurality of memory cells and a memory controller. The memory controller is configured to generate a histogram indicating, with respect to each of a plurality of threshold voltage levels for multi-level cell (MLC) reading, a number of memory cells at the threshold voltage level, based on data read from the plurality of memory cells using a plurality of reference read voltages, estimate a plurality of read voltages for MLC reading of the plurality of memory cells as estimation values by inputting the histogram into a read voltage estimation model, determine, through MLC reading of the plurality of memory cells using a plurality of sets of read voltages, a set of read voltages for MLC reading as observation values, and update one or more parameters of the read voltage estimation model based on the estimation values and the observation values.

20 Claims, 12 Drawing Sheets

MEMORY SYSTEM

CROSS-REFERENCE TO RELATED APPLICATION(S)

This application is based upon and claims the benefit of priority from Japanese Patent Application No. 2020-051262, filed Mar. 23, 2020, the entire contents of which are incorporated herein by reference.

FIELD

Embodiments described herein relate generally to a memory system.

BACKGROUND

A memory system having a non-volatile memory cell is known. In such a memory system, during a read operation, the data stored in a non-volatile memory cell is determined (read) based on comparison between a threshold voltage of the memory cell and an applied read voltage.

The written threshold voltage of the memory cell may change/vary due to various factors over time. In general, a memory system is capable of changing the read voltage such that correct data can still be obtained from the memory cell even if the threshold voltage of the memory cell has changed.

DETAILED DESCRIPTION

Embodiments provide a memory system in which accuracy of estimating a read voltage is improved.

In general, according to an embodiment, a memory system includes a non-volatile memory having a plurality of memory cells and a memory controller. The memory controller is configured to generate a histogram indicating, with respect to each of a plurality of threshold voltage levels for multi-level cell (MLC) reading, a number of memory cells at the threshold voltage level, based on data read from the plurality of memory cells using a plurality of reference read voltages, estimate a plurality of read voltages for MLC reading of the plurality of memory cells as estimation values by inputting the histogram into a read voltage estimation model, determine, through MLC reading of the plurality of memory cells using a plurality of sets of read voltages, a set of read voltages for MLC reading as observation values, and update one or more parameters of the read voltage estimation model based on the estimation values and the observation values of read voltages.

Hereinafter, a memory system according to certain example embodiments will be described with reference to the accompanying drawings. The present disclosure is not limited to the following example embodiments.

First Embodiment

Figure 1:
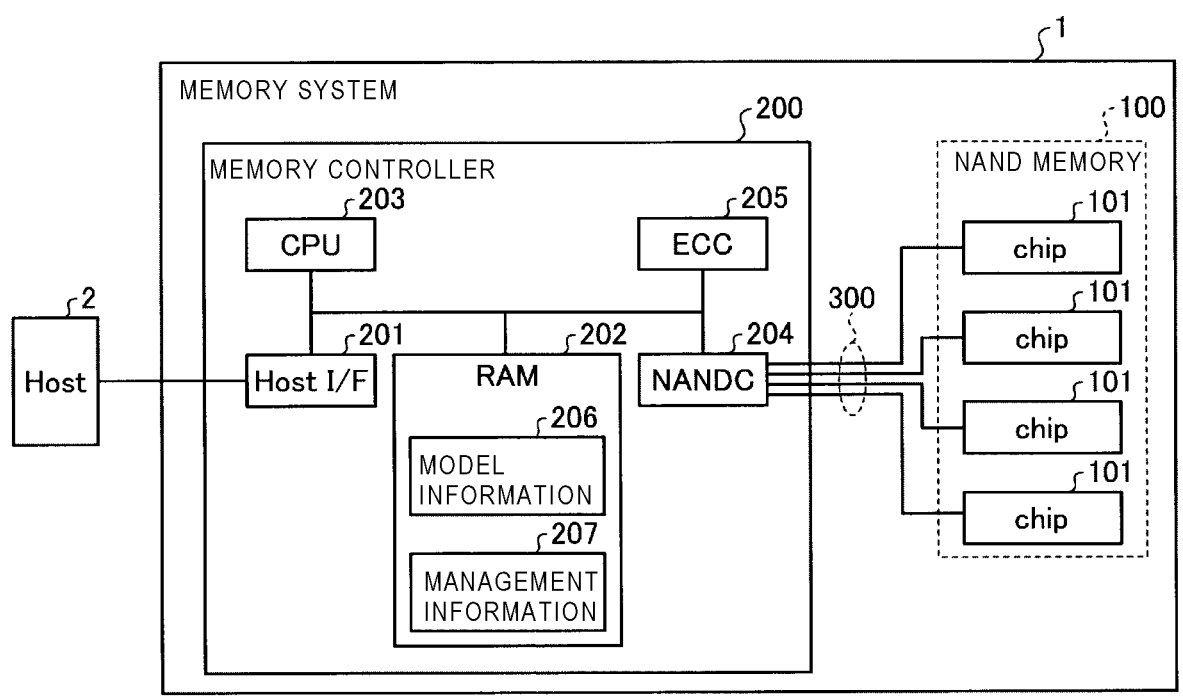
FIG. 1 is a schematic diagram showing an example of a configuration of a memory system according to an embodiment.

FIG. 1 is a schematic diagram showing an example of a configuration of a memory system 1 according to an embodiment. The memory system 1 is connectable to a host 2. For example, a personal computer, a personal digital assistant, or a server can be appropriately used as the host 2.

The memory system 1 can receive an access request from the host 2. The access request includes a read command and a write command.

The memory system 1 includes a NAND flash memory (NAND memory) 100 as a non-volatile memory and a memory controller 200. The NAND memory 100 and the memory controller 200 are electrically connected to each other via a bus 300 having a plurality of channels.

The memory controller 200 executes data transfer between the host 2 and the NAND memory 100. The memory controller 200 includes a host interface (Host I/F) 201, a random access memory (RAM) 202, a central processing unit (CPU) 203, a NAND controller (NANDC) 204, and an error correction circuit (ECC) 205. The host interface 201, the RAM 202, the CPU 203, the NANDC 204, and the ECC 205 are communicably connected to one another via, for example, a bus.

The memory controller 200 may be implemented by, for example, a system-on-a-chip (SoC). The memory controller 200 may be implemented by a plurality of chips. The memory controller 200 may include a field-programmable gate array (FPGA) or an application specific integrated circuit (ASIC) instead of the CPU 203. The memory controller 200 may further include a dedicated calculation unit or a digital signal processor (DSP) capable of performing parallel processes. That is, the memory controller 200 may be implemented by software, hardware, or a combination thereof.

The RAM 202 is a memory used as a buffer or a work area of the CPU 203. A type of the memory in the RAM 202 may not be limited to a specific type. For example, the RAM 202 is implemented by a dynamic random access memory (DRAM), a static random access memory (SRAM), or a combination thereof.

The host interface 201 controls a communication interface with the host 2. The host interface 201 executes data transfer between the host 2 and the RAM 202 under the control of the CPU 203. The NANDC 204 executes data transfer between the NAND memory 100 and the RAM 202 under the control of the CPU 203.

The CPU 203 controls the host interface 201, the RAM 202, the NANDC 204, and the ECC 205. The CPU 203 executes, for example, a firmware program loaded into the RAM 202 to implement the control of the various components described above.

The ECC 205 encodes data to be sent to the NAND memory 100. Encoding is encoding with an error correction code. The ECC 205 executes decoding on the data sent from the NAND memory 100, thereby performing detection and correction of a bit error included in the data.

An encoding method used by the ECC 205 is not limited to a specific method. For example, low density parity check (LDPC) may be employed as the encoding method.

The NAND memory 100 includes one or more memory chips (Chips) 101. Each of the one or more memory chips 101 is electrically connected to the NANDC 204 via the bus 300. Here, for example, the NAND memory 100 includes four memory chips 101.

Figure 2:
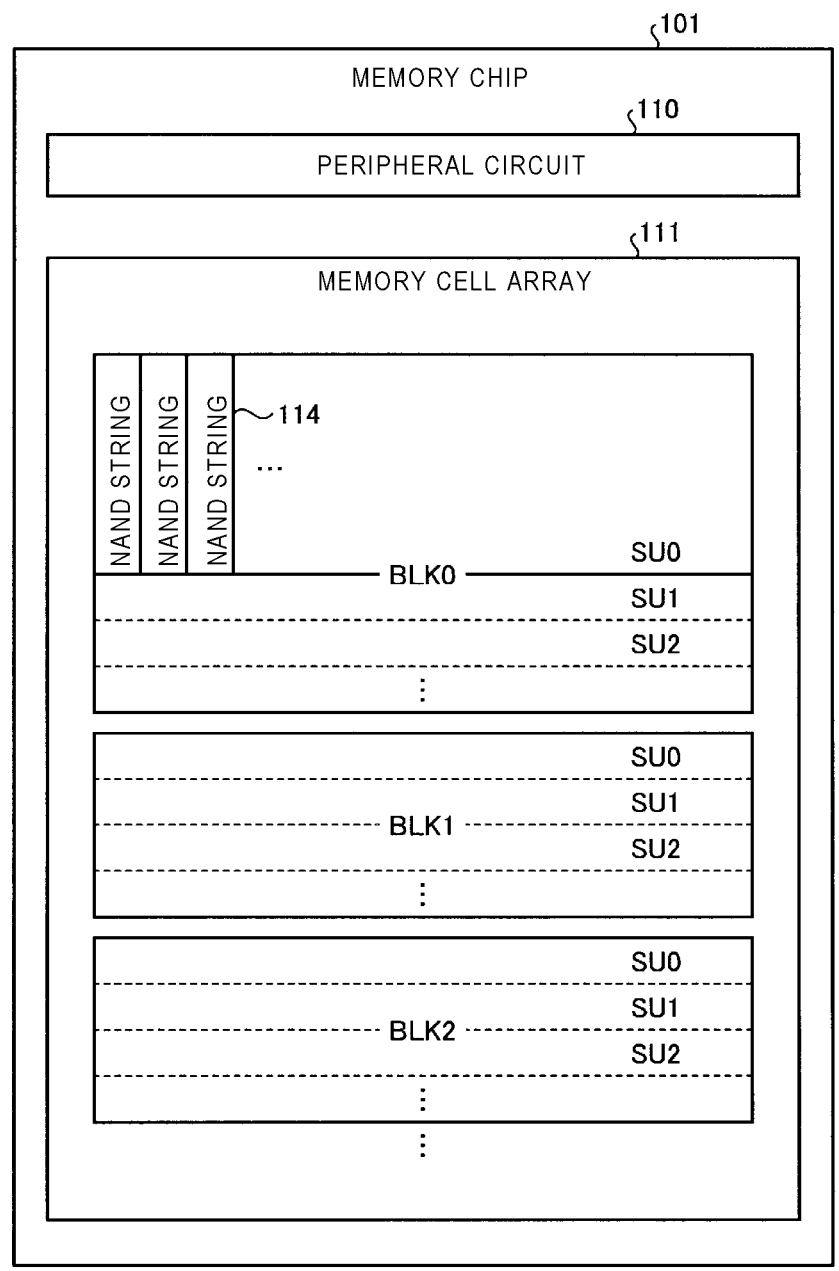
FIG. 2 is a schematic diagram showing an example of a configuration of a memory chip in a memory system.

FIG. 2 is a schematic diagram showing an example of a configuration of the memory chip 101 in FIG. 1. As illustrated, the memory chip 101 includes a peripheral circuit 110 and a memory cell array 111.

The memory cell array 111 includes a plurality of blocks BLKs (BLK0, BLK1, BLK2, . . . ), each of which is a set of a plurality of non-volatile memory cell transistors. Each of the plurality of blocks BLKs includes a plurality of string units SUs (SU0, SU1, SU2, . . . ), each of which is a set of memory cell transistors associated with word lines and a bit line. Each of the plurality of string units SUs includes a plurality of NAND strings 114 in which the memory cell transistors are connected in series. The number of the NAND strings 114 in the string unit SU is not particularly limited.

The peripheral circuit 110 includes, for example, a row decoder, a column decoder, a sense amplifier, a latch circuit, and a voltage generation circuit. When receiving a command from the memory controller 200, the peripheral circuit 110 executes an operation corresponding to the command, among a program operation, a read operation, and an erase operation, on the memory cell array 111.

Figure 3:
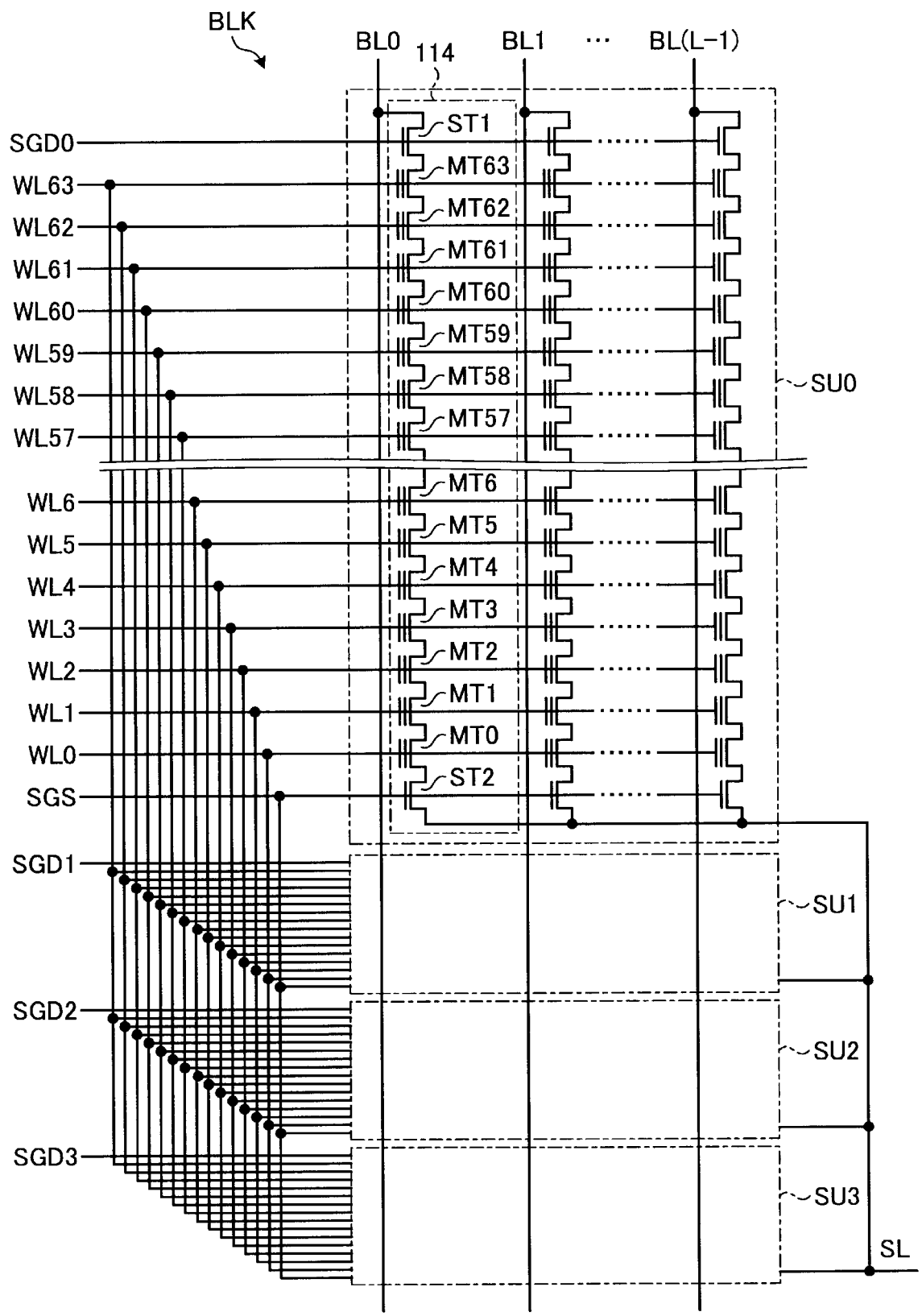
FIG. 3 is a schematic diagram showing an example of a circuit configuration of a block illustrated in FIG. 2.

FIG. 3 is a schematic diagram showing an example of a circuit configuration of the block BLK in FIG. 2. Each of the blocks BLKs has the same configuration. The block BLK includes, for example, four string units SU0 to SU3. Each string unit SU includes the plurality of NAND strings 114.

Each of the plurality of NAND strings 114 includes, for example, 64 memory cell transistors MTs (MT0 to MT63) and select transistors ST1 and ST2. The memory cell transistor MT includes a control gate and a charge accumulation layer, and stores data in a non-volatile manner. The 64 memory cell transistors MTs (MT0 to MT63) are connected in series between a source of the select transistor ST1 and a drain of the select transistor ST2. The memory cell transistor MT may be of a Metal-Oxide-Nitride-Oxide-Semiconductor (MONOS) type using an insulating film as the charge accumulation layer, and may be of a Floating-Gate (FG) type using a conductive film as the charge accumulation layer. Further, the number of memory cell transistors MTs in the NAND string 114 is not limited to 64.

Gates of the select transistors ST1 of the string units SU0 to SU3 are respectively connected to select gate lines SGD0 to SGD3. On the other hand, gates of the select transistors ST2 of the string units SU0 to SU3 are commonly connected to, for example, a select gate line SGS. The gates of the select transistors ST2 of the string units SU0 to SU3 may be connected to different select gate lines SGS0 to SGS3 for each string unit SU. Control gates of the memory cell transistors MT0 to MT63 in the same block BLK are connected to word lines WL0 to WL63, respectively. Hereinafter, a word line WL may be referred to as the word line.

The drains of the select transistors ST1 of the NAND strings 114 in each string unit SU are connected to different bit lines BLs (BL0 to BL (L−1), where L is a natural number of 2 or more). In addition, the bit line BL commonly connects one NAND string 114 in the string units SUs among the plurality of blocks BLKs. Further, the sources of the select transistors ST2 are commonly connected to a source line SL.

That is, the string unit SU is a set of NAND strings 114 connected to different bit lines BL and connected to the same select gate line SGD. In addition, the block BLK is a set of a plurality of string units SU having a common word line WL. The memory cell array 111 is a set of a plurality of blocks BLKs having a common bit line BL.

The program operation and the read operation of the peripheral circuit 110 can be collectively executed on the memory cell transistor MT connected to one word line WL in one string unit SU. A collection of one-bit data on which the program operation or the read operation can be executed for one word line WL in one string unit SU is referred to as a "page".

The erase operation of the peripheral circuit 110 is executed in unit of block BLK. That is, all pieces of data stored in one block BLK are erased at once.

Figure 4:
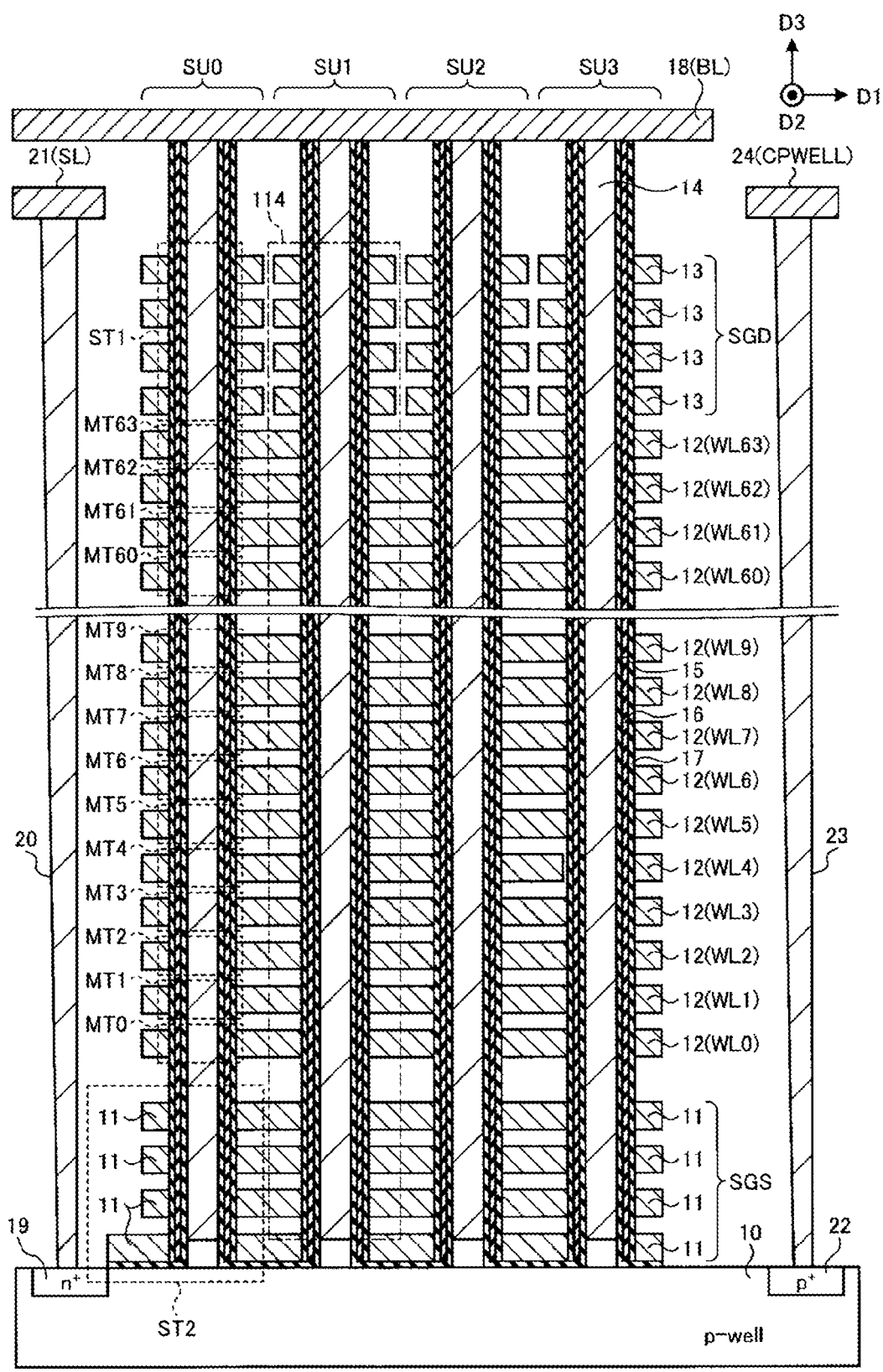
FIG. 4 illustrates a cross-sectional view of a partial region of the block illustrated in FIG. 3.

FIG. 4 illustrates a cross-sectional view of a partial region of the block in FIG. 3. As shown in FIG. 4, the plurality of NAND strings 114 are formed on a p-type well region (semiconductor substrate) 10. That is, 4-layer wiring layers 11 that function as select gate lines SGS, 64-layer wiring layers 12 that function as the word lines WL0 to WL63, and 4-layer wiring layers 13 that function as select gate lines SGD are sequentially stacked on the well region 10. An insulating film is formed between the stacked wiring layers.

A pillar-shaped conductor 14 penetrating the wiring layers 13, 12, and 11 and reaching the well region 10 is formed. A gate insulating film 15, a charge accumulation layer (insulating film or conductive film) 16, and a block insulating film 17 are sequentially formed on a side surface of the conductor 14, through which the memory cell transistors MTs and the select transistors ST1 and ST2 are formed. The conductor 14 functions as a current path of the NAND string 114, and serves as a region in which a channel of each transistor is formed. An upper end of the conductor 14 is connected to a metal wiring layer 18 that functions as the bit line BL.

An n+-type impurity diffusion layer 19 is formed in a surface region of the well region 10. A contact plug 20 is formed on the diffusion layer 19, and the contact plug 20 is connected to a metal wiring layer 21 that functions as a source line SL. Further, a p+-type impurity diffusion layer 22 is formed in the surface region of the well region 10. A contact plug 23 is formed on the diffusion layer 22, and the contact plug 23 is connected to a metal wiring layer 24 that functions as a well wiring CPWELL. The well wiring CPWELL is a wiring for applying a voltage to the conductor 14 through the well region 10.

A plurality of the above configurations are arranged in a second direction D2, which is parallel to the semiconductor substrate, and the string unit SU is formed by a set of the plurality of NAND strings 114 arranged in the second direction D2.

The configuration shown in FIGS. 2 to 4 is an example. The configuration of the memory cell array 111 is not limited to the above configuration. For example, the memory cell array 111 may have a configuration in which the NAND strings 114 are arranged two-dimensionally.

Hereinafter, the memory cell transistor MT is simply referred to as a memory cell.

Figure 5A:
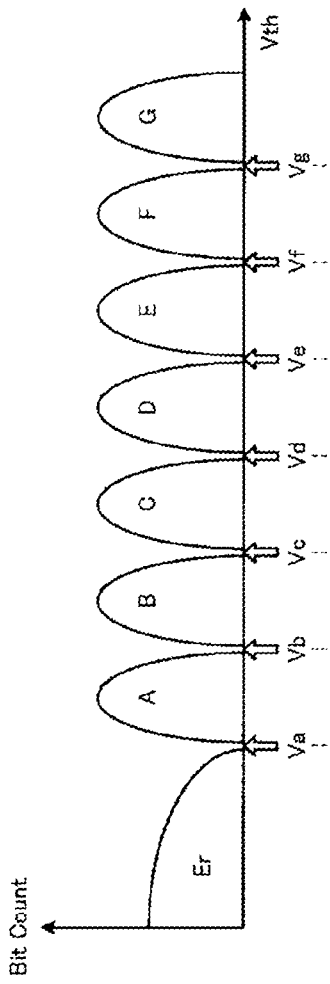
FIGS. 5A, 5B, and 5C are schematic diagrams showing examples of distributions of threshold voltages of memory cells.
Figure 5B:
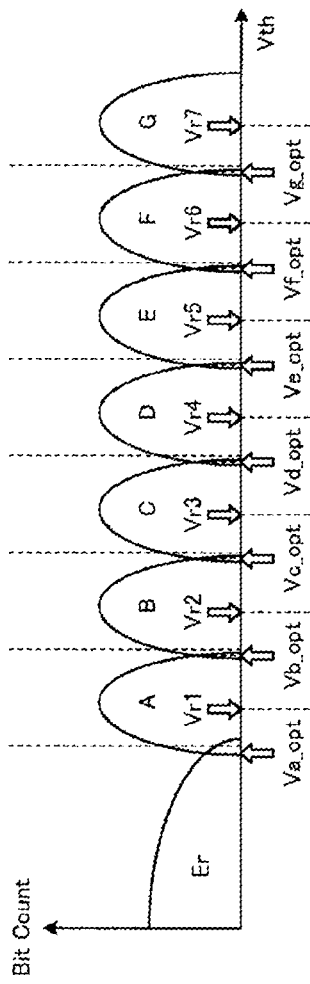
Figure 5C:
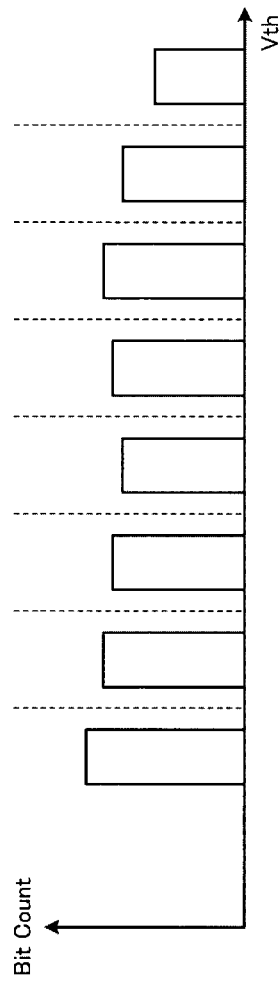

FIGS. 5A, 5B, and 5C are schematic diagrams showing examples of distributions of threshold voltages of the memory cells in FIGS. 3 and 4. In three graphs in FIGS. 5A, 5B, and 5C, a vertical axis indicates the number of memory cells (bit count), and a horizontal axis indicates a threshold voltage (Vth). That is, the figure shows the distribution of the number of memory cells with respect to the threshold voltage.

In the example described below, unless otherwise specified, a method referred to as triple-level cell (TLC) is applied as a method of storing data in each memory cell. According to the TLC method, each memory cell can store three-bit data. That is, in the present embodiment, a case where a memory cell can store data of eight values will be described, and the present embodiment is not limited to such a configuration. Data that can be stored by the memory cell can be data of two or more values (data of one bit or more). The TLC method is an example of a multi-level cell (MLC) method.

As shown in FIGS. 5A, 5B, and 5C, in the case of the TLC, a possible range of the threshold voltage is divided into eight ranges. These eight divisions are referred to as an "Er" state, an "A" state, a "B" state, a "C" state, a "D" state, an "E" state, an "F" state, and a "G" state in order from a lower threshold voltage. The peripheral circuit 110 controls the threshold voltage of each memory cell to belong to any one of the "Er" state, the "A" state, the "B" state, the "C" state, the "D" state, the "E" state, the "F" state and the "G" state during the program operation.

As a result, when plotting the number of memory cells with respect to the threshold voltage, the distribution of the threshold voltage of the memory cell forms eight lobes, each belonging to a different state, as shown in FIG. 5A.

The eight states correspond to different three-bit data. For example, the "Er" state corresponds to "111". The "A" state corresponds to "110". The "B" state corresponds to "100". The "C" state corresponds to "000". The "D" state corresponds to "010". The "E" state corresponds to "011". The "F" state corresponds to "001". The "G" state corresponds to "101". In this way, each memory cell can store data corresponding to the state to which the threshold voltage belongs. A correspondence shown in FIG. 5A is an example of data coding, and the present embodiment is not limited to such a configuration.

Each digit of the three-bit data stored in one memory cell is expressed by a name corresponding to a position. For example, a least significant bit (LSB) is referred to as a lower bit, a most significant bit (MSB) is referred to as an upper bit, and a bit between the LSB and MSB is referred to as a middle bit.

The threshold voltage is lowered to the "Er" state by the erase operation. Further, by the program operation, the threshold voltage is maintained in the "Er" state, or is raised to any one of the "A" state, the "B" state, the "C" state, the "D" state, the "E" state, the "F" state, and the "G" state.

Specifically, in the program operation, the peripheral circuit 110 selects a bit line BL corresponding to a column address. The peripheral circuit 110 sets a voltage of the selected bit line BL to zero. The peripheral circuit 110 selects a word line WL corresponding to a row address, and applies a programming pulse to the selected word line WL. Then, electrons are injected into the charge accumulation layer 16 of the memory cell located at an intersection between the selected bit line BL and the selected word line WL. As a result, the threshold voltage of the memory cell rises. The peripheral circuit 110 reads data at a predetermined timing to confirm whether the threshold voltage of the memory cell reaches a target state corresponding to write data (verify read). The peripheral circuit 110 continues application of the programming pulse until the threshold voltage of the memory cell reaches the target state.

Hereinafter, a memory cell for which a threshold voltage has been set (programmed) to a certain state by the program operation may be referred to as a "memory cell belonging to that state" or a "memory cell having that state."

A voltage for determining data is set at a boundary between two adjacent states. This voltage is referred to as an actual read voltage Va to Vg in order to distinguish from a reference read voltage Vr1 to Vr7. In some instances, the "actual read voltage" may be more simply referred to as the "read voltage."

For example, as illustrated in FIG. 5A, an actual read voltage Va is set between the "Er" state and the "A" state. An actual read voltage Vb is set between the "A" state and the "B" state. An actual read voltage Vc is set between the "B" state and the "C" state. An actual read voltage Vd is set between the "C" state and the "D" state. An actual read voltage Ve is set between the "D" state and the "E" state. An actual read voltage Vf is set between the "E" state and the "F" state. An actual read voltage Vg is set between the "F" state and the "G" state. That is, in a TLC mode in which eight states can be set, seven actual read voltages are set. In the read operation, the peripheral circuit 110 identifies the state to which the memory cell belongs by using the actual read voltages at a plurality of points, and decodes the identified state into data.

Specifically, in the read operation, the peripheral circuit 110 precharges a power supply voltage to the bit line BL. The peripheral circuit 110 selects a word line WL corresponding to the row address. The peripheral circuit 110 brings a memory cell belonging to a non-selected word line WL into a conductive state, and sequentially applies a plurality of actual read voltages to the selected word line WL. The peripheral circuit 110 determines the data corresponding to the state to which the target memory cell belongs by detecting which actual read voltage is applied when an electric charge accumulated by precharging flows out to the source line SL. The peripheral circuit 110 stores the determined data into the latch circuit. The memory controller 200 can acquire data in the latch circuit as read data by, for example, toggling a read enable (RE) signal.

Here, the threshold voltage of the memory cell may change due to various factors. The threshold voltage of a memory cell may change due to, for example, an access to the memory cell, an elapsed time, and temperature history from completion of the program to the memory cell, an access to a memory cell adjacent to the memory cell, and an amount of wear of the memory cell. The amount of wear of the memory cell is influenced by the number of times the erase operation/program operation is executed for the memory cell and a temperature during the erase operation/program operation for the memory cell. When the threshold voltage of the memory cell changes, for example, as shown in FIG. 5B, the distribution of the states may be in a state of overlapping with each other in the read operation.

Thus, the read data may change from the value in the programming due to the change of the threshold voltage.

When part or all of the threshold voltage lobe exceeds the actual read voltage at the boundary between the states, erroneous determination of the data occurs. That is, when part or all of the threshold voltage lobe exceeds a set value of the actual read voltage at the boundary between the states, a value different from that in the program operation is read. Among the read data, the value different from that in the program operation is referred to as a bit error.

In the memory controller 200, at least one of the processor such as the CPU 203 and the ECC 205 can deal with the bit error by error correction (decoding) and shift of the actual read voltages. Hereinafter, a case where the error correction (decoding) is executed by the ECC 205, and the shift of the actual read voltages is executed by a processor (CPU 203) will be described.

For example, the memory controller 200 performs the error correction using the ECC 205 on the data acquired from the NAND memory 100. When the error correction fails, the memory controller 200 estimates optimum values of the actual read voltages Va to Vg, sets estimation values of the optimum values of the actual read voltages Va to Vg obtained by the estimation as new set values of the actual read voltages Va to Vg, and retries the read operation. The estimation value of the optimum value of the actual read voltage is hereinafter referred to as the estimation value of the actual read voltage. An observation value of the optimum value of the actual read voltage is referred to as an observation value of the actual read voltage. The read operation to be retried is referred to as a read retry operation.

Here, the failure of the error correction means that the data before the change cannot be restored from the data after the change. Specifically, the failure of the error correction means that the error bit included in the read data cannot be corrected. Success of the error correction means that all error bits included in the read data are corrected.

The actual read voltages set by the memory controller 200 are included in, for example, management information 207 loaded into the RAM 202 as shown in FIG. 1.

In the management information 207, the set values of the actual read voltages are recorded for each predetermined unit region. The unit region is, for example, a block BLK. That is, the set values of the common actual read voltages are used for all the memory cells in one block BLK. The unit region is not limited to the block BLK. The unit region may be a word line, a page, or the like.

In the example of FIG. 1, the management information 207 is stored in the RAM 202. For example, the management information 207 is saved in the NAND memory 100 from the RAM 202 before power-off of the memory system 1. After start-up of the memory system 1, the management information 207 is loaded from the NAND memory 100 into the RAM 202. The management information 207 may not be saved in the NAND memory 100. A position at which the management information 207 is stored is not limited to the RAM 202.

The set values of the actual read voltages set by the memory controller 200 may be transmitted to the peripheral circuit 110 by any applicable method.

For example, the set values of the actual read voltages are transmitted together with a data-read-command transmitted from the memory controller 200 to the memory chip 101. In this case, the memory controller 200 includes the set values of the actual read voltages in a command sequence of the data-read-command and transmits the set values to the memory chip 101. In the memory chip 101 that receives the command sequence, the peripheral circuit 110 reads the data of the memory cell to be read by applying voltages of the set values of the actual read voltages included in the command sequence to the memory cell to be read via the word line.

For another example, the set values of the actual read voltages are sent to the memory chip 101 by a command different from the data-read-command. The peripheral circuit 110 includes a feature register capable of storing various types of parameters. For example, the feature register is capable of storing the set values of the actual read voltages as a type of parameter. When receiving the data-read-command from the memory controller 200, the peripheral circuit 110 acquires the set values of the actual read voltages from the feature register, and reads the data in the memory cell to be read by applying the voltages of the set values to the memory cell to be read via a word line. The feature register can be set to a value by using a set feature command. That is, the memory controller 200 can transmit the set values of the actual read voltages to the memory chip 101 by using the set feature command. The set values of the actual read voltages are not limited to being transmitted by using the set feature command, and may be transmitted by any other applicable command.

The set values of the actual read voltages may be sent to the memory chip 101 as numerical information indicating voltage values, or may be sent to the memory chip 101 as numerical information expressed as a difference from a predetermined reference voltage value.

The optimum values of the actual read voltages Va to Vg are values of the actual read voltages Va to Vg that can reduce an occurrence rate of the bit error as much as possible. The optimum values of the actual read voltages Va to Vg only need to be values for minimizing the occurrence rate of the bit error, and are not limited to threshold voltages at minimum points of the memory cell distribution. Values of the threshold voltage at points other than the minimum points may be used as the optimum values of the actual read voltages Va to Vg.

FIG. 5B shows a distribution of the threshold voltages obtained after the memory system 1 is used for a while after the distribution shown in FIG. 5A is obtained. As shown in FIG. 5B, eight lobes corresponding to different states are different in shape and position from the eight lobes shown in FIG. 5A. Bases of the eight lobes overlap to form one continuous distribution. When such a distribution is obtained, if seven minimum points of the distribution are set as the actual read voltages Va to Vg, it is considered that the occurrence rate of the bit error can be minimized. That is, the optimum values of the actual read voltages Va to Vg in the distribution of the state in FIG. 5B are Va_opt, Vb_opt, Vc_opt, Vd_opt, Ve_opt, Vf_opt, and Vg_opt.

In the present embodiment, the memory controller 200 estimates the actual read voltages Va to Vg by using a distribution (histogram) of threshold voltages described below and an estimation function (coefficient matrix). Here, the estimation function (coefficient matrix) is an example of a read voltage estimation model showing a relationship between the histogram and the actual read voltages Va to Vg. Hereinafter, the read voltage estimation model may be simply referred to as a model.

Specifically, the memory controller 200 generates (acquires) a histogram indicating, with respect to each of threshold voltage levels, the number of memory cells at the threshold voltage level, by executing the read using one or more predetermined reference read voltages Vr1 to Vr7. In other words, the memory controller 200 generates a histogram indicating, with respect to each of the threshold voltage levels, the number of memory cells at the threshold voltage level, based on a result of reading a plurality of memory cells using a plurality of reference read voltages. For example, the memory controller 200 generates a histogram for, for example, each word line, each page, or each block of a plurality of memory cells. The memory controller 200 inputs the generated histogram into a model (coefficient matrix). The memory controller 200 acquires an output of the model (coefficient matrix) corresponding to the input of the histogram as the estimation values of the actual read voltages Va to Vg. In other words, the memory controller 200 acquires a result obtained by multiplying the acquired histogram by the coefficient matrix as the estimation values of the actual read voltages Va to Vg. In addition, the memory controller 200 executes the read using the estimation values of the actual read voltages Va to Vg as the actual read voltages for determining data, that is, the set values of the actual read voltages Va to Vg. In other words, the memory controller 200 reads data stored in the plurality of memory cells based on the estimation values of the actual read voltages Va to Vg output from the model (coefficient matrix).

In the example of FIG. 5B, seven reference read voltages Vr1, Vr2, Vr3, Vr4, Vr5, Vr6, and Vr7 are set in advance.

When the reference read voltage Vri (where i is an integer from 1 to 7) is applied to the word line, among the plurality of memory cells connected to the word line, a memory cell having a threshold voltage lower than Vri is in an on state, and a memory cell having a threshold voltage higher than Vri is in an off state. Whether the memory cell is in the on state or the off state is determined by a sense amplifier in the peripheral circuit 110.

The memory controller 200 causes the peripheral circuit 110 to sequentially apply the reference read voltages Vr1 to Vr7 to a target word line in the peripheral circuit 110, and to determine whether each memory cell is in the on state or the off state for each reference read voltage. The memory controller 200 counts the number of memory cells in a predetermined state selected from the on state and the off state among the plurality of memory cells connected to the target word line for each reference read voltage. Then, based on a count value obtained for each reference read voltage, the memory controller 200 generates a histogram in which eight sections divided by seven reference read voltages Vr1 to Vr7 are set as bins and the number of memory cells therein is set as a frequency value.

For example, when the number of memory cells in the on state when the reference read voltage Vri is applied is expressed as $C_i$, and the number of memory cells connected to the target word line is expressed as $C_{mt}$, a frequency value of a section (bin) between reference read voltages Vrj and Vr(j+1) can be obtained as a calculation of $C(j+1)-C_j$. Here, j is an integer from 1 to 6. The frequency of the section (bin) below reference read voltage Vr1 is equal to $C_1$. The frequency value of the section (bin) greater than reference read voltage Vr7 is the number of memory cells from $C_7$ to $C_{mt}$.

FIG. 5C is a schematic diagram showing a histogram obtained by the above process.

The reference read voltages Vr1 to Vr7 are set in advance. The method of setting the reference read voltages Vr1 to Vr7 is not limited to any specific method.

For example, an initial value of each of the seven actual read voltages Va to Vg may be determined in advance, and the memory controller 200 may set each actual read voltage in the peripheral circuit 110 using a difference from the initial value of each actual read voltage. In such a case, initial values of the seven actual read voltages Va to Vg may be used as the seven reference read voltages Vr1 to Vr7.

In the examples of FIGS. 5A, 5B, and 5C, the number of reference read voltages is equal to the number of actual read voltages. The number of reference read voltages may be different from the number of actual read voltages. For example, the number of reference read voltages is three, and the memory controller 200 may generate a histogram having four bins using the three reference read voltages.

Figure 6:
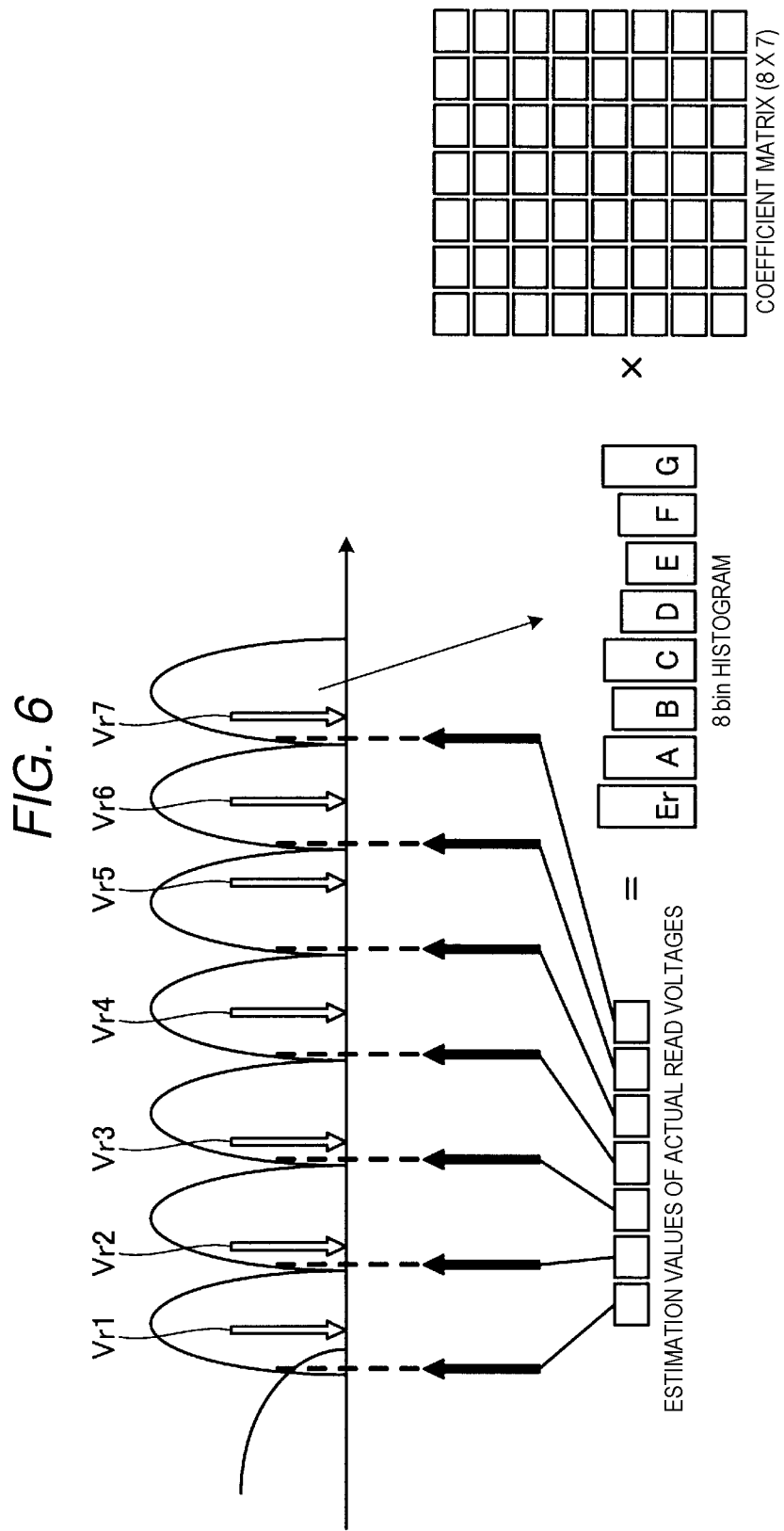
FIG. 6 is a diagram schematically showing an outline of an estimation operation for estimating an actual read voltage by using an estimator, which is executed in a memory system.

FIG. 6 is a diagram schematically showing an outline of an estimation operation of estimating the actual read voltages Va to Vg by using an estimator (coefficient matrix), which is executed in the memory system 1 in FIG. 1. The coefficient matrix is, for example, a model for calculating an estimation value of the actual read voltages by a product of a vector having a frequency value corresponding to each write level of the histogram as an element and the coefficient matrix. For example, when the memory cell is TLC and the write level is eight (Er, A, B, C, D, E, F, G), the coefficient matrix is an 8×7 matrix for estimating seven actual read voltages based on a vector having eight different frequencies corresponding to the eight write levels. FIG. 6 shows an example in which the memory controller 200 generates a histogram having eight bins using seven reference read voltages Vr1 to Vr7. As shown in FIG. 6, the estimator of the memory controller 200 estimates seven actual read voltages Va to Vg as a product of a vector having frequencies corresponding to the eight bins (write levels) of the histogram as elements and an 8×7 coefficient matrix.

The number of reference read voltages is not necessarily seven. For example, by using eight or more reference read voltages, a histogram can be generated with higher accuracy. By using less than seven reference read voltages, the process can be performed at a higher speed.

If an encoding method for a certain error correction code is set, the reference read voltage and coefficient matrix can be calculated, that is, offline learned, for example, before a vendor (e.g., a manufacturer of the memory system 1, vendor of the memory controller 200, vendor of the NAND memory 100, or the like) ships the product including the NAND memory 100 to which the encoding method is applied. That is, the memory controller 200 can read, from the NAND memory 100, model information 206 (coefficient matrix) and management information 207 (reference read voltage) that has been calculated before shipment and stored in the NAND memory 100 or the like and then later use this information. The pre-stored read model information 206 and the read management information 207 can be loaded into the RAM 202, as shown in FIG. 1.

However, when a parameter of the coefficient matrix (estimator) is calculated (learned) before the product is shipped (that is, in the case of offline learning) if the memory system 1 is placed under a situation or an environment that was not expected prior to the shipment of the product, the estimation accuracy of the estimator may decrease. Thus, the memory system 1 according to the present embodiment may acquire learning data after the shipment process, that is, under an actual environment, and repeatedly updates the parameters of the estimator by online learning over time.

Figure 7:
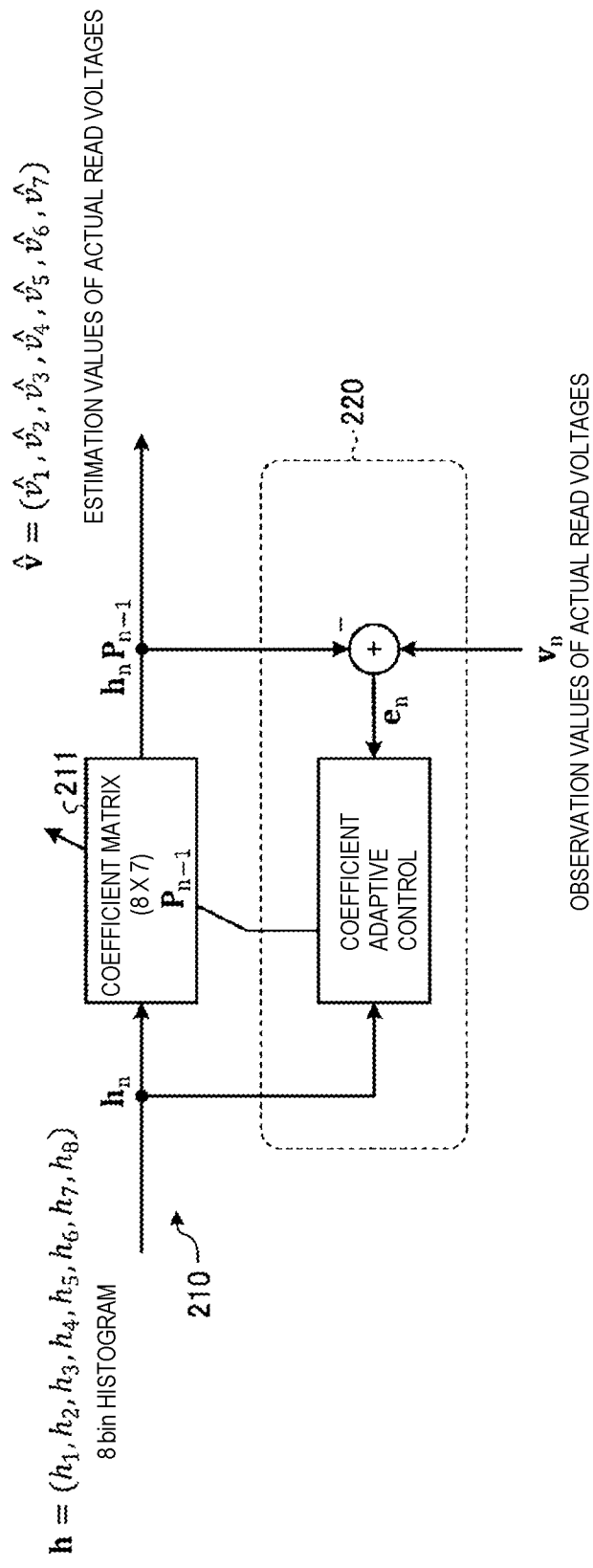
FIG. 7 is a diagram showing an example of a functional configuration of a memory system.
Figure 8:
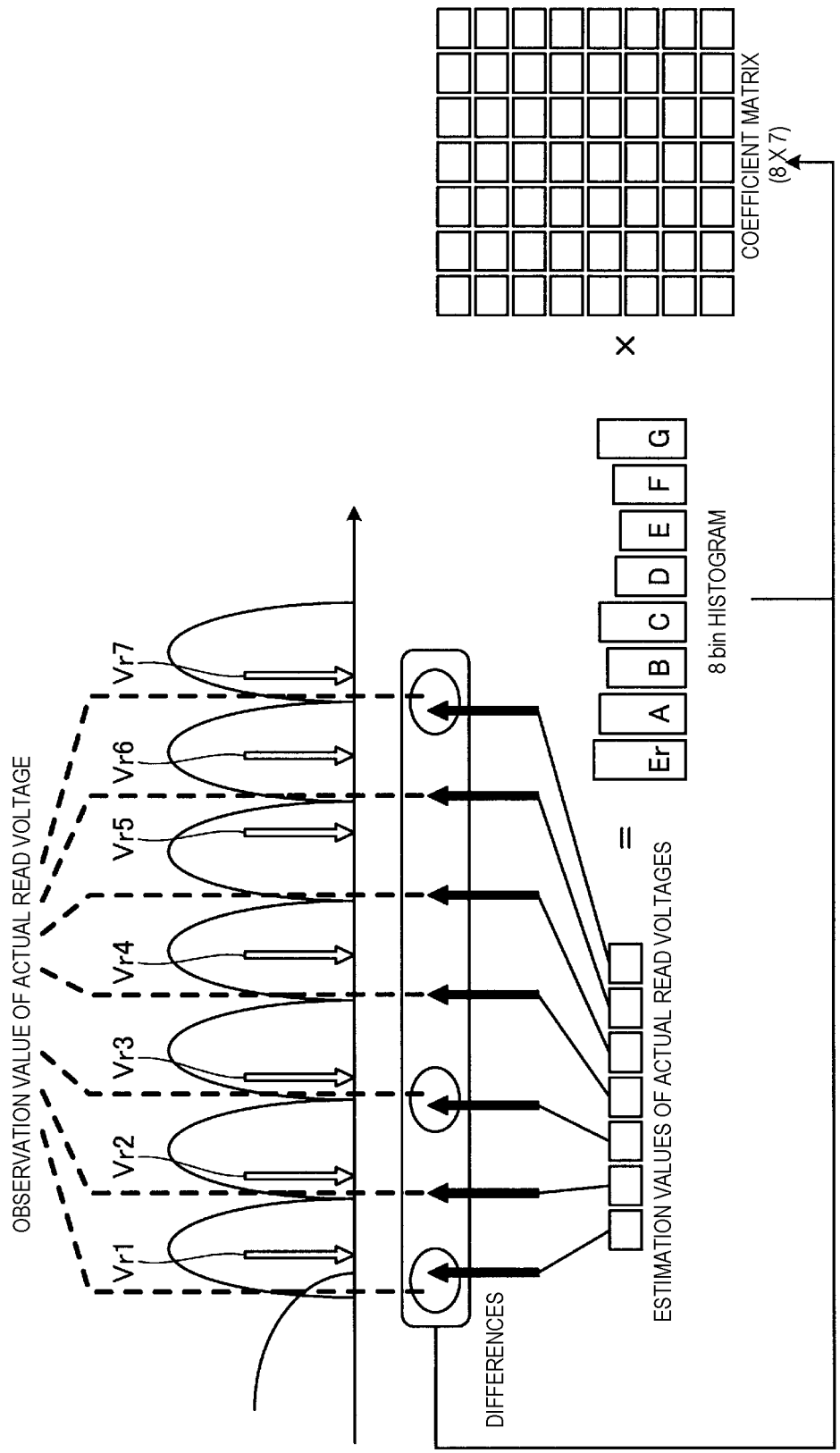
FIG. 8 is a diagram schematically showing an outline of an update operation of updating a parameter of an estimator using a learning device, which is executed in a memory system.

FIG. 7 is a diagram showing an example of a functional configuration of the memory system 1 in FIG. 1. The CPU 203 executes, for example, a firmware program loaded into the RAM 202 to implement functions as an estimator 210 and a learner 220. FIG. 8 is a diagram schematically showing an outline of an update operation of updating the parameter of the estimator 210 using the learner 220, which is executed in the memory system 1 in FIG. 1.

In the example of FIG. 1, the model information 206 (coefficient matrix 211) is stored in the RAM 202. For example, the model information 206 is saved in the NAND memory 100 from the RAM 202 before power interruption of the memory system 1. After the start-up of the memory system 1, the model information 206 is loaded from the NAND memory 100 into the RAM 202. In an alternative embodiment, the model information 206 may not be saved in the NAND memory 100. The location at which the model information 206 is stored is not limited to the RAM 202, and may be stored in a memory provided outside the memory controller 200.

In the example shown in FIG. 7, a coefficient matrix $P_{n-1}$ represents a coefficient matrix P before update. A vector h is a vector having a frequency value (e.g., the number of memory cells) corresponding to each write level (Er, A, B, C, D, E, F, G) of the histogram as an element. A vector $h_n$ is a vector h obtained in the read operation during the parameter update. As shown in FIG. 7, a vector $\hat{v}$ is a vector having seven estimation values of the actual read voltages as elements obtained by the product of the vector h and the coefficient matrix P in a read operation. Here, the vector h, the vector $\hat{v}$, and the vector $\hat{v}_n$ are represented as the following formulas (1), (2), and (3), respectively.

$$h = (h_1, h_2, h_3, h_4, h_5, h_6, h_7, h_8) \quad \text{Formula (1)}$$

$$\hat{v} = (\hat{v}_1, \hat{v}_2, \hat{v}_3, \hat{v}_4, \hat{v}_5, \hat{v}_6, \hat{v}_7) \quad \text{Formula (2)}$$

$$\hat{v}_n = h_n P_{n-1} \quad \text{Formula (3)}$$

In addition, in FIG. 7, a vector $v_n$ is a vector having observation values of seven actual read voltages as elements. The observation values are calculated based on data read by soft decision read (observation) executed in, for example, the read operation by a specific method of calculating the observation values, which will be described below.

Figure 9:
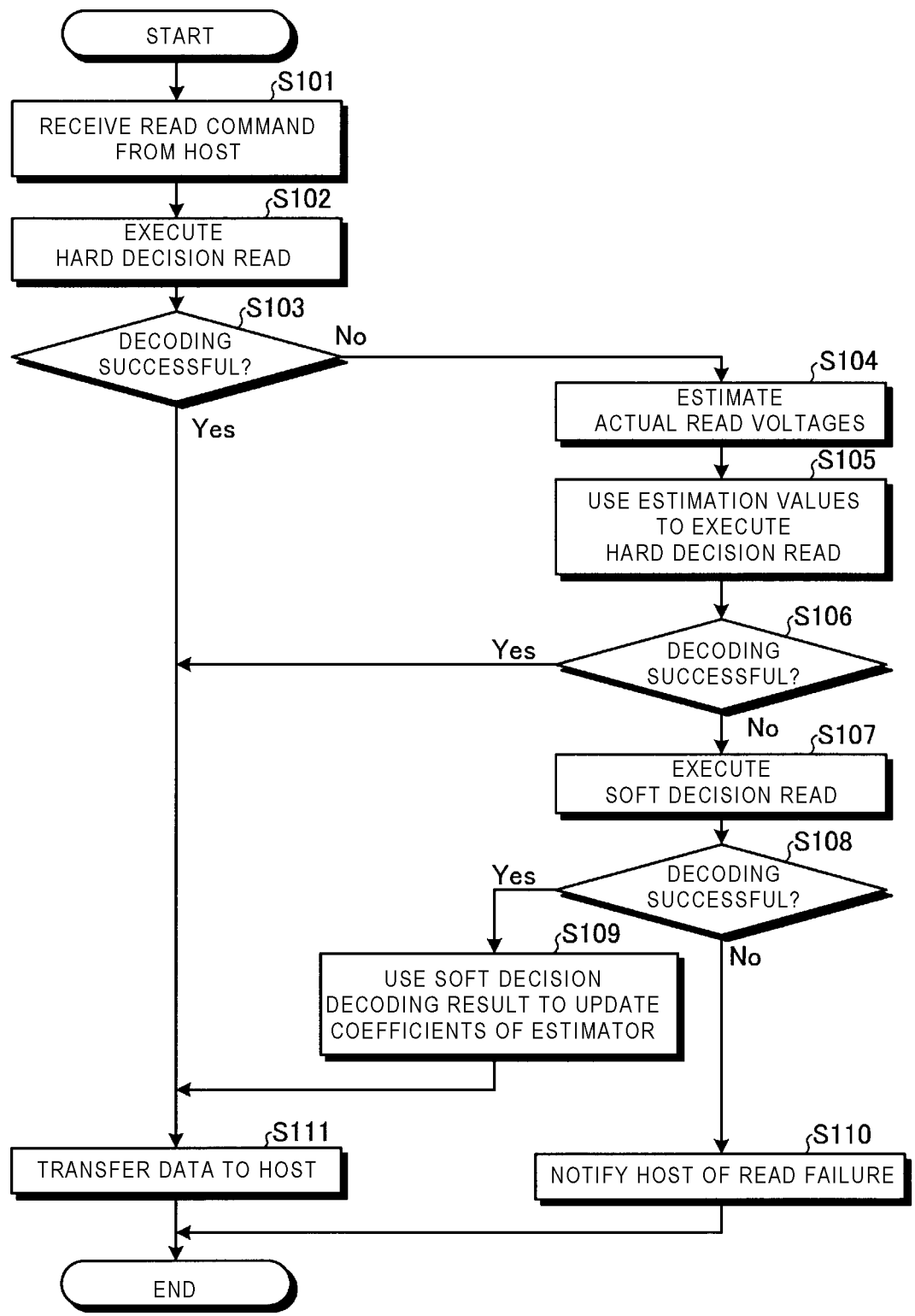
FIG. 9 is a flowchart of a read operation executed in a memory system.

Therefore, the update of the coefficient matrix in the read operation (see FIG. 9: S109) is a process executed in a state where a set of learning data including the vector $\hat{v}_n$ and the vector $v_n$ is obtained.

When the set of learning data is obtained in this manner, the memory controller 200 updates one or more parameters (e.g., each parameter) of the model (coefficient matrix P) based on an error between the vector $\hat{v}_n$ and the vector $v_n$, that is, differences between the estimation values of the actual read voltages output from the model (coefficient matrix P) and the observation values of the actual read voltages, as shown in FIG. 8. More specifically, the memory controller 200 updates the coefficient matrix P such that the differences between the estimation values of the actual read voltages and the observation values of the actual read voltages are small. Here, a vector $e_n$ indicating an error between the vector $\hat{v}_n$ and the vector $v_n$ is represented by the following formula (4).

$$e_n = v_n - h_n P_{n-1} \quad \text{Formula (4)}$$

For example, the learner 220 according to the present embodiment updates the coefficient matrix P by coefficient adaptive control using an update formula shown in the following formula (5). Here, a learning rate μ is a parameter indicating a degree (strength) of update in the update operation. As a value of the learning rate μ, a moderately small value is used.

$$P_n \leftarrow P_{n-1} + \mu h_n^T(v_n - h_n P_{n-1})$$

$$0 < \mu \quad \text{Formula (5)}$$

Here, a product of a transposed vector of the vector $h_n$ and the vector $e_n$ indicating the error is defined as a matrix Q. At this time, the right two items of the update formula are a product of the learning rate μ and the matrix Q. The matrix Q corresponds to a matrix obtained by inverting a sign of differentiation of the coefficient matrix P of a squared error. Here, the squared error and the differentiation of the coefficient matrix P of the squared error are represented by the following formulas (6) and (7), respectively.

Squared Error:

$$(hP-v)(hP-v)^T \quad \text{Formula (6)}$$

Differentiation for coefficient matrix P of squared error:

$$2h^T(hP-v) \quad \text{Formula (7)}$$

A case where a differential value of the squared error (loss function) with respect to a certain component of the coefficient matrix P is positive indicates that the loss function increases as the component increases. That is, when the differential value with respect to the certain component is positive, the loss function decreases as the component decreases. On the other hand, when the differential value with respect to the certain component is negative, the loss function decreases as the component increases. In this way, the update formula (5) is configured to reduce the squared error based on the above-mentioned relationship between the loss function and its differential value with respect to each component of the coefficient matrix P. Therefore, by updating the coefficient matrix P using the above-described update formula, the loss function (squared error) can be reduced.

Hereinafter, an example of the operation of the memory system 1 according to the present embodiment will be described in more detail with reference to the drawings.

FIG. 9 is a flowchart showing an example of the read operation executed in the memory system 1 in FIG. 1. FIG. 9 illustrates a flow of the read operation for one block that is executed at any applicable timing.

First, the memory controller 200 executes hard decision read (S102) in response to, for example, receiving a read command from the host 2 (S101). In the hard decision read, data is read using the voltages of the set values of the actual read voltages, and hard decision decoding is executed on the read data by, for example, the ECC 205. The hard decision decoding may be executed by a processor such as the CPU 203, or may be executed by the processor and the ECC 205.

Following the process of S102, the memory controller 200 determines whether the decoding by the ECC 205 is successful in the hard decision read (S103). When the decoding is successful (S103: Yes), the memory controller 200 transfers the read data to the host 2 (S111), and ends the read operation for the one block.

On the other hand, when the decoding fails (S103: No), the memory controller 200 starts the read retry operation (S104 to S108).

In the read retry operation, the memory controller 200 executes the estimation operation of estimating the actual read voltages by using the histogram and the coefficient matrix as described above (S104). Further aspects of the estimation operation will be described below. The CPU 203 records, as the set values of the actual read voltages, the estimation values of the actual read voltages obtained by the estimation operation into the management information 207. Thereafter, the memory controller 200 uses the set values of the actual read voltages recorded in the management information 207, that is, the actual read voltages estimated by the estimation operation, to execute the hard decision read in the same manner as the process of S102 (S105). The memory controller 200 determines whether the decoding is successful in the same manner as the process in S103 (S106). When the decoding is successful (S106: Yes), the memory controller 200 transfers the read data to the host 2 (S111), and then ends the read operation for the one block.

On the other hand, when the decoding fails (S106: No), the memory controller 200 executes soft decision read (S107). The soft decision read is executed by a processor such as the CPU 203, or may be executed by the ECC 205, or may be executed by the processor and the ECC 205. In the above-described hard decision read, it is determined whether the threshold voltage of the memory cell is higher than that in a boundary that divides a threshold voltage distribution by applying one actual read voltage corresponding to the boundary. On the other hand, in the soft decision read, the observation value of the actual read voltage with respect to the boundary is calculated by reading a plurality of actual read voltages for one boundary to be determined.

Various methods can be used as a method (read method) for calculating the observation value of the actual read voltage. Specifically, for example, a read method using a shift table (hereinafter referred to as shift table read), shift read, and tracking read (also referred to as Vth tracking) can be used.

The shift table read is a read operation for specifying an index that specifies an actual read voltage set that leads to successful reading by preparing a shift table in which a plurality of actual read voltage sets are registered for each page type (for example, LOWER/MIDDLE/UPPER page), and executing a read operation by sequentially using each of the plurality of actual read voltage sets. In other words, the read operation is a read operation for specifying the actual read voltage set by sequentially comparing each of the plurality of actual read voltage sets with the threshold voltage distribution of the plurality of memory cells of the NAND memory 100.

The shift read is a read operation performed by using a voltage value shifted from a read voltage set in advance. The shift read is performed by setting, for example, a search region including a read voltage set in advance corresponding to the distribution of each threshold voltage, changing the read voltage by a fixed amount in the search region, executing the read operation on the NAND memory 100 for each read voltage, and determining the observation value of the actual read voltage based on the read voltage having a smallest number of error bits in the read data.

The tracking read is, for example, a read operation that generates a histogram of the distribution of the threshold voltage programmed in a plurality of memory cells in the corresponding page by executing the read operation a plurality of times while shifting the read voltage by a predetermined increment width. The tracking read can identify and set a position of a valley in the generated histogram as the actual read voltage to be utilized for reading data.

The tracking read may be a read method performed on the memory controller 200 side or a read method performed inside the NAND memory 100 (also referred to as On-Chip Tracking Read).

Following the process of S107, the memory controller 200 determines whether the decoding is successful, for example, in the same manner as the process of S103 and S108 (S108). When the decoding fails (S108: No), the memory controller 200 notifies the host 2 of the read failure (S110), and ends the read operation for the one block.

On the other hand, when the decoding is successful (S108: Yes), as will be described below, the learner 220 of the memory controller 200 executes the update operation of updating the one or more parameters of the estimator 210, that is, the coefficient matrix P, using the observation values of the actual read voltages (S109). The update operation will be described below. After the update operation, the CPU 203 updates the model information 206. Further, the CPU 203 records, as the set values of the actual read voltages, the observation values of the actual read voltages obtained by the soft decision read into the management information 207. When the memory controller 200 next reads data to the NAND memory 100, the set values of the actual read voltages recorded in the management information 207, that is, the observation values of the actual read voltages obtained by the soft decision read is used. Thereafter, the memory controller 200 transfers the read data to the host 2 (S111), and ends the read operation for the one block.

Figure 10:
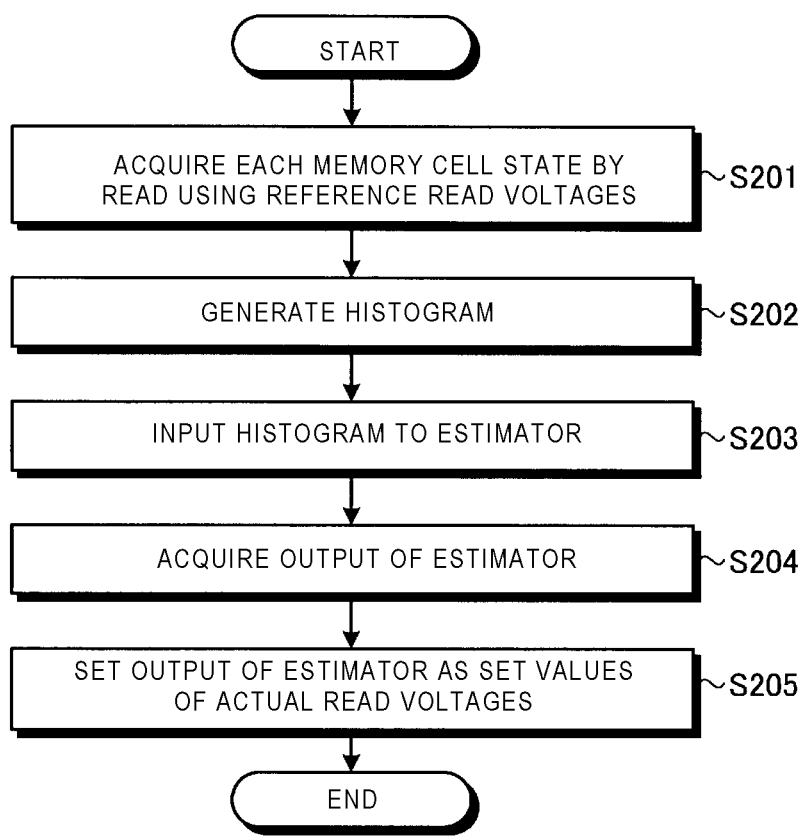
FIG. 10 is a flowchart of an estimation operation in a read operation.

FIG. 10 is a flowchart showing an example of the estimation operation (S104) in the read operation in FIG. 9. The memory controller 200 acquires a state of each memory cell for each reference read voltage by the read using the reference read voltages Vr1 to Vr7 for a target word line (S201). Thereafter, the memory controller 200 (for example, the CPU 203) generates a histogram based on the state of each memory cell for each reference read voltage (S202). The memory controller 200 (for example, CPU 203) inputs the generated histogram to the estimator 210 (S203), and then acquires output of the estimator 210 corresponding to the input histogram (S204). The memory controller 200 sets the acquired output of the estimator 210, that is, the estimation values of the actual read voltages, to the set values of the actual read voltages.

Figure 11:
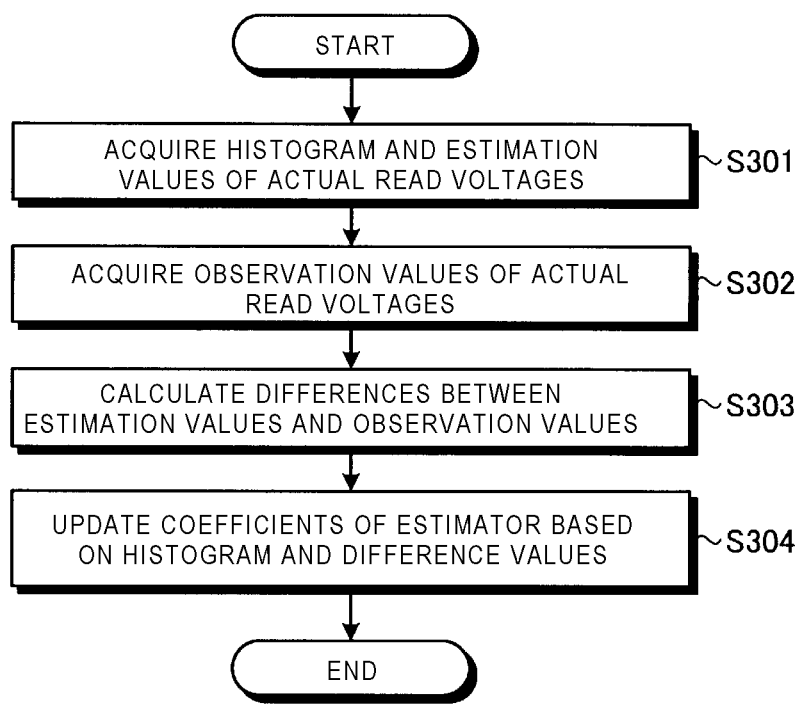
FIG. 11 is a flowchart of an update operation in a read operation.

FIG. 11 is a flowchart showing an example of the update operation (S109) in the read operation in FIG. 9. The memory controller 200 (for example, the CPU 203) acquires a histogram and estimation values of the actual read voltages (S301), and also acquires observation values of the actual read voltages (S302). Here, the acquisition includes, for example, reading a value temporarily stored in the RAM 202. Thereafter, the memory controller 200 calculates a difference (vector $e_n$) between the estimation values of the actual read voltages and the observation values of the actual read voltages according to the above-described update formula (S303), and updates the parameters of the estimator 210, that is, the components of the coefficient matrix 211 by using the histogram (vector h) and the difference (vector $e_n$) (S304).

In the present embodiment, the case where the estimation values of the actual read voltages are calculated when the decoding fails in the hard decision read is illustrated; however, the present embodiment is not limited to such a configuration. A calculation timing for the estimation values of the actual read voltages is not limited to the read operation, and may be at any applicable timing. That is, in the hard decision read, estimation values calculated at a timing different from the read operation may be used.

In the present embodiment, the case where the observation values of the actual read voltages are calculated in the soft decision read is illustrated; however, the present embodiment is not limited to such a configuration. A calculation timing for the observation values of the actual read voltages is not limited to the soft decision read, and may be at any applicable timing.

In the present embodiment, the memory controller 200 that executes the update operation when the decoding in the soft decision read is successful after the decoding in the hard decision read fails is illustrated, and the present embodiment is not limited to such a configuration. For example, when being successful in decoding in the hard decision read (S106: Yes), the memory controller 200 may execute the update operation (S109). However, when the update operation is executed every time the hard decision decoding is successful, the frequency of the update operation increases. Since the hard decision decoding was successful, it is preferable for the frequency of the update operation to not be high, from the viewpoint of calculation cost and the like. Therefore, for example, the memory controller 200 executes the update operation (S109) only if the number of correction bits in the hard decision read is equal to or greater than a predetermined threshold value among the successful decoding in the hard decision read (S106: Yes). The number of correction bits in the hard decision read is output from, for example, the ECC 205. Whether the number of correction bits in the hard decision read is equal to or greater than the predetermined threshold value may be determined based on the output of a decoder before or after the error correction (decoding). Here, it is assumed that the predetermined threshold value is set in advance and stored in the management information 207 or the like. As the predetermined threshold value, for example, a value such as 80% of the number of bits that can be decoded by the hard decision decoding can be appropriately used. In addition, the memory controller 200 performs additional read in order to calculate the observation values of the actual read voltages. The observation values of the actual read voltages may be calculated by any applicable method as described above.

The read operation according to the present embodiment is not limited to being executed during a host read, and may be instead or additionally executed during a patrol read executed as a background process or the like. As described above, a host read refers to a read operation corresponding to a request (read command) received from the host 2. On the other hand, a patrol read refers to a read operation performed by the memory system 1, for example, at a preset cycle or time, without specific request or command from a host 2.

In this way, the memory controller 200 according to the present embodiment uses a set of learning data to update the coefficient matrix P of the estimator 210 (parameters of the model) such that the loss function is reduced. The set of learning data includes the observation values of the actual read voltages and the histogram. Here, the observation values of the actual read voltages refer to optimum values of the actual read voltages obtained in a state where a write value is known. The histogram is used in the estimation operation of estimating the actual read voltages in the read operation. More specifically, the memory controller 200 according to the present embodiment updates the parameters of the estimator 210 based on the differences between the estimation values of the actual read voltages output from the estimator 210 in response to the input of the histogram and the observation values of the actual read voltages.

According to the configuration, the learning data can be acquired under the actual environment, and the parameters of the estimator 210 can be sequentially updated by online learning. Therefore, even if the memory system 1 is placed under a situation or an environment that cannot be expected during the product shipment, or, even if characteristics of individual memory systems 1 are different due to manufacturing variations or the like, the parameters can be adjusted according to the situation, environment, and characteristics. Therefore, according to the technique of the present embodiment, it is possible to provide the memory system 1 for which the accuracy of the estimation of the read voltages is improved. According to the technique of the present embodiment, since the learning data can be acquired under the actual environment, it is possible to shorten a preparation period of the learning data before shipment of the product.

Second Embodiment

For another example, the learner 220 according to the present embodiment updates the coefficient matrix P by coefficient adaptive control using an update formula shown in the following formula (8). Here, a regularization parameter α is a parameter for preventing an extreme change in the coefficient matrix P in an update operation, that is, an amplitude associated with the update of each component. As a value of the regularization parameter α, a moderately small value is used. Here, a regularization matrix $I_\alpha$ including the regularization parameter is expressed by the following formula (9).

$$P_n \leftarrow P_{n-1} I_\alpha + \mu h_n^T (v_n - h_n P_{n-1}) \quad \text{Formula (8)}$$

$$I_\alpha = \begin{bmatrix} 1-\alpha & 0 & \cdots & 0 \\ 0 & 1 & & \vdots \\ \vdots & & \ddots & 0 \\ 0 & \cdots & 0 & 1 \end{bmatrix} \quad 0 < \mu, 0 < \alpha \quad \text{Formula (9)}$$

In this way, the learner 220 according to the present embodiment makes regularization of the coefficient matrix by subtracting a value proportional to the current coefficient when updating the coefficient matrix P. According to the configuration, since it is possible to prevent the extreme change in each component of the coefficient matrix P without being dragged too much by the observation values of the actual read voltages at each update time, an estimation result can be stabilized and accuracy of read voltage estimation can be further improved.

The present embodiment exemplifies an update formula that regularizes a first read level; however, the present embodiment is not limited to such a configuration. The regularization may be performed on any read level. In addition, the regularization may be performed on a plurality of read levels.

Third Embodiment

For yet another example, the learner 220 according to the present embodiment updates the coefficient matrix P by coefficient adaptive control using an update formula shown in the following formula (10). Here, a weighting matrix $K_n$ in an update formula is represented by the following formula (11).

$$P_n \leftarrow P_{n-1} + \mu h_n^T (v_n - h_n P_{n-1}) K_n \quad \text{Formula (10)}$$

$$K_n = \begin{pmatrix} k_{1,n} & 0 & 0 & 0 & 0 & 0 & 0 \\ 0 & k_{2,n} & 0 & 0 & 0 & 0 & 0 \\ 0 & 0 & k_{3,n} & 0 & 0 & 0 & 0 \\ 0 & 0 & 0 & k_{4,n} & 0 & 0 & 0 \\ 0 & 0 & 0 & 0 & k_{5,n} & 0 & 0 \\ 0 & 0 & 0 & 0 & 0 & k_{6,n} & 0 \\ 0 & 0 & 0 & 0 & 0 & 0 & k_{7,n} \end{pmatrix} \quad 0 < \mu \quad \text{Formula (11)}$$

Here, each element of a diagonal component of the weighting matrix $K_n$ shown in formula (11) has a value proportional to the number of bit errors corresponding to each read level (write level). Specifically, each diagonal component on lines 1 to 7 corresponds to each read level from A to G. For example, when the number of bit errors is large, each element of the diagonal component of the weighting matrix $K_n$ has a large value. On the other hand, when the estimation result is stable, that is, when differences between the estimation values of the actual read voltages output from the estimator 210 and the observation values of the actual read voltages is small, each element of the diagonal component of the weighting matrix $K_n$ has a small value.

In this way, the memory controller 200 (learner 220) according to the present embodiment updates the parameters of the model (coefficient matrix 211) of the estimator 210 by performing weighting in accordance with the number of bit errors corresponding to each read level when data stored in a plurality of memory cells is read. According to the configuration, since the parameters of the estimator 210 can be adjusted in accordance with the actual number of bit errors, accuracy of the estimation of the read voltages can be further improved.

The present embodiment exemplifies the weighting matrix $K_n$ having a value proportional to the number of bit errors corresponding to each read level as each element of the diagonal component; however, the present embodiment is not limited to such a configuration. The weighting matrix $K_n$ may be extracted by a column of read levels to be updated, that is, used to update the coefficient matrix P in a state where other columns are masked. According to the configuration, it is possible to update only necessary elements with a small amount of data.

In the update formulas according to the present embodiment, the learning rate μ may be prepared for each read level, similarly to the weighting matrix $K_n$. At this time, a matrix having a plurality of learning rates μ prepared for each component of the coefficient matrix P may be used together with the weighting matrix $K_n$, or may be used instead of the weighting matrix $K_n$.

Fourth Embodiment

Figure 12:
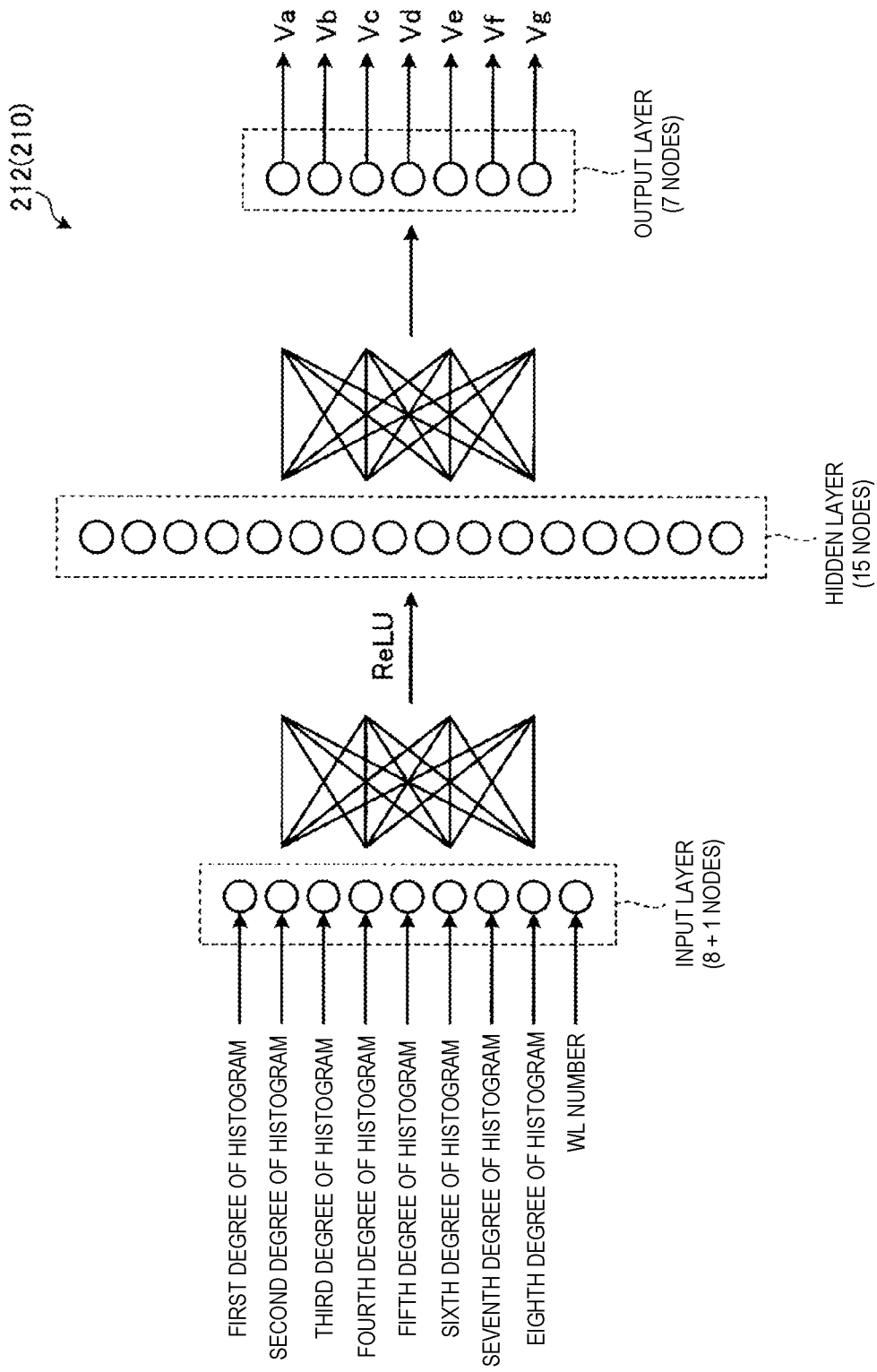
FIG. 12 is a schematic diagram showing an example of a configuration of an estimator according to an embodiment.

For still another example, the estimator 210 according to the present embodiment estimates the actual read voltages by using a machine learning model. FIG. 12 is a schematic diagram showing an example of a configuration of the estimator 210 (neural network 212) according to the present embodiment. The neural network 212 includes a multi-layer perceptron (MLP) having one hidden layer (intermediate layer).

The machine learning model according to the present embodiment is a composite function having parameters for which a plurality of functions can be combined. This is defined by a combination of adjustable functions and parameters. The machine learning model according to the present embodiment may be any applicable composite function having parameters defined by a combination of a plurality of adjustable functions and parameters, and is at least a multi-layer network model. The machine learning model according to the present embodiment may be implemented as a convolutional neural network (CNN) model, or may be a fully connected network model. Hereinafter, the machine learning model according to the present embodiment is more simply referred to as a neural network.

The memory system 1 according to the present embodiment may further include a graphics processing unit (GPU) in addition to the CPU 203. That is, inference of the actual read voltages using the neural network and update of the parameters of the neural network may be performed using the GPU.

In addition, the neural network may be implemented by a dedicated hardware circuit instead of the CPU 203 or the GPU. For example, the memory system 1 includes a dedicated calculation unit or DSP capable of performing parallel processes. For example, a neural network may include a group of processor units including registers, multipliers, and adders. The processor units are connected to each other via a connection relationship similar to that of nodes of the neural network, and the group of processor units can be made to function as a neural network by storing learned weights in the register of each processor unit.

In the example in FIG. 12, data input to an input layer is a vector x including eight values of a histogram and one WL number r. The vector x as the input data is represented by the following formula (12). Here, the vector x as the input data corresponds to the vector h according to the above-described embodiment.

$$x=(h_1, h_2, \ldots, h_8, r) \quad \text{Formula (12)}$$

The input layer has a number of nodes (eight in the example in FIG. 12) corresponding to the number of bins included in the histogram as nodes to which the histogram is input. The input layer includes a number of nodes (here, one) corresponding to the number of word line WLs corresponding to the histogram as nodes to which the WL number is input. Here, it is assumed that the input layer outputs the input data as it is. An input layer $z^{(1)}$ is represented by the following formula (13).

$$z^{(1)}=x \quad \text{Formula (13)}$$

The intermediate layer includes one or more nodes (15 in the example in FIG. 12). In the intermediate layer, each node multiplies each input value from a bias and nodes in the previous layer by a weight, applies an activation function to a sum of the values after the weight is multiplied, and outputs a value obtained by the application of the activation function. Each weight is determined in advance by, for example, offline learning before shipment of a product. That is, the neural network 212 is learned in advance so as to map the input data (vector x) including the histogram and the word line WL number to the actual read voltages Va to Vg. An intermediate layer $z^{(2)}$ is represented by the following formulas (14) and (15) by using a coefficient matrix $W^{(2)}$ of 9×15 and a bias term vector $b^{(2)}$ of 15 elements. An activation function f(•) uses, for example, a rectified linear unit (ReLU) function. Here, the coefficient matrix $W^{(2)}$ corresponds to the coefficient matrix P according to the above-described embodiments.

$$u^{(2)}=z^{(1)}W^{(2)}+b^{(2)} \quad \text{Formula (14)}$$

$$z^{(2)}=f(u^{(2)}) \quad \text{Formula (15)}$$

An output layer includes a number of nodes (seven in the example in FIG. 12) corresponding to the number of actual read voltages Va to Vg. An output layer $z^{(3)}$ is represented by the following formulas (16) and (17) by using a coefficient matrix $W^{(3)}$ of 15×7 and a bias term vector $b^{(3)}$ of seven elements. Here, the coefficient matrix $W^{(3)}$ corresponds to the coefficient matrix P according to the above-described embodiments. In the example in FIG. 12, the activation function is not used in the output layer; however, the present embodiment is not limited to such a configuration. Any applicable activation function may be used in the output layer.

$$u^{(3)}=z^{(2)}W^{(3)}+b^{(3)} \quad \text{Formula (16)}$$

$$z^{(3)}=u^{(3)} \quad \text{Formula (17)}$$

Data output from the output layer is a vector y of seven elements, and is represented by the following formulas (18) and (19). Here, the vector y as the output data is the estimation value of the actual read voltage, and corresponds to the vector $\hat{v}$ according to the above-described embodiment.

$$y=z^{(3)} \qquad \text{Formula (18)}$$

$$y=(y_1, y_2, \ldots, y_7) \qquad \text{Formula (19)}$$

Therefore, the estimation operation (S104) of the estimator 210 according to the present embodiment can be represented by the following formula (20). That is, in accordance with the input of the histogram and the word line WL number, the memory controller 200 estimates the actual read voltage by inputting a corresponding word line WL number (vector x) along with the histogram generated by the process of S202 into the neural network 212 (estimator 210) whose parameter is learned to output the estimation values of the actual read voltages and acquiring the output (vector y) of the neural network 212 according to the input (S204).

$$y=f(xW^{(2)}+b^{(2)})W^{(3)}+b^{(3)} \qquad \text{Formula (20)}$$

The reference read voltages Vr1 to Vr7 used to generate the histogram (S201, S202) are equal to the reference read voltages used to obtain the histogram used as the learning data on an input side during the learning of the neural network 212. In addition, the number of the word line WL on which the read operation (S201) is executed using the reference read voltages is stored in the management information 207.

The configuration of the neural network 212 described above is recorded into the model information 206 similar to the coefficient matrix 211 according to the above-described embodiments. The model information 206 includes, for example, a definition of a plurality of nodes, a definition of a connection relationship between nodes, and a bias. In the model information 206, each node is associated with a learned weight. In the model information 206, the activation function is associated with nodes in a part of the layers.

Next, the update operation (S109) according to the present embodiment will be described. In the following description, a flow after a set of learning data $(x_n, d_n)$ is obtained for one word line WL related to any block at any time (acquisition time point) will be mainly described. Here, the vector $x_n$ is learning data on the input side, and is a vector x obtained by reading from one word line WL related to any block at any time (acquisition time point). The vector $d_n$ is learning data on an output side, and is an observation values of the actual read voltages of the word line WL corresponding to the learning data on the input side. Here, the vector $d_n$ is the observation values of the actual read voltages, and corresponds to the vector v according to the above-described embodiment.

The memory controller 200 uses a stochastic gradient decent (SGD) method to update the parameters of each layer of the neural network 212 by coefficient adaptive control using update formulas shown in the following formulas (21), (22), (23) and (24). In the update formulas shown below, a coefficient ε is a coefficient indicating an update degree, and corresponds to the learning rate μ according to the above-described embodiments. A moderately small value is used as the value of the coefficient ε.

$$W^{(3)} \leftarrow W^{(3)} - \epsilon \partial W_n^{(3)} \qquad \text{Formula (21)}$$

$$W^{(2)} \leftarrow W^{(2)} - \epsilon \partial W_n^{(2)} \qquad \text{Formula (22)}$$

$$b^{(3)} \leftarrow b^{(3)} - \epsilon \partial b_n^{(3)} \qquad \text{Formula (23)}$$

$$b^{(2)} \leftarrow b^{(2)} - \epsilon \partial b_n^{(2)} 0 < \epsilon \qquad \text{Formula (24)}$$

Similarly to the above-described embodiments, the update formula is defined such that a positive component of a differential value becomes small and a negative component of the differential value becomes large with respect to a loss function. That is, the update formula is configured to reduce the squared error based on the above-mentioned relationship between the loss function and its differential value with respect to each component of the coefficient matrix P. Specifically, the memory controller 200 executes gradient calculation of parameters of the neural network 212 using back propagation of each layer with respect to the loss function. Here, in the update operation according to the present embodiment, the loss function corresponding to the set of learning data $(x_n, d_n)$ is set as in the following formula (25). A diagonal component of the weighting matrix $K_n$ of the loss function is the number of bit errors corresponding to each read level, as in the above-described embodiments.

$$E_n = (y_n - d_n) K_n (y_n - d_n)^T \qquad \text{Formula (25)}$$

1×7 delta $\delta_n^{(3)}$, 15×7 differentiation $\partial W_n^{(3)}$, and 1×7 differentiation $\partial b_n^{(3)}$ are represented as the following formulas (26), (27) and (28), respectively. Here, the delta $\delta_n^{(3)}$ is an output of the neural network 212 in response to the input of the learning data (vector $x_n$) on the input side in the forward propagation, and is an input of the output layer $z^{(3)}$ in the back propagation. The differentiation $\partial W_n^{(3)}$ is the differentiation with respect to coefficients of the output layer $z^{(3)}$ of the loss function (formula(25)), and is calculated using the input to the output layer $z^{(3)}$ in the forward propagation, that is, the output of the intermediate layer $z^{(2)}$ in the forward propagation, and the delta $\delta_n^{(3)}$. The differentiation $\partial b_n^{(3)}$ is the differentiation with respect to the bias $b_n^{(3)}$ of the output layer $z^{(3)}$ of the loss function (formula (25)) and is the delta $\delta_n^{(3)}$.

$$\delta_n^{(3)} = (y_n - d_n) K_n \qquad \text{Formula (26)}$$

$$\partial W_n^{(3)} = z_n^{(2)T} \delta_n^{(3)} \qquad \text{Formula (27)}$$

$$\partial b_n^{(3)} = \delta_n^{(3)} \qquad \text{Formula (28)}$$

1×15 delta $\delta_n^{(2)}$, 9×15 differentiation $\partial W_n^{(2)}$, and 1×15 differentiation $\partial b_n^{(2)}$ are represented as the following formulas (29), (30) and (31), respectively. Here, the delta $\delta_n^{(2)}$ is an output corresponding to the input of the delta $\delta_n^{(3)}$ from the output layer $z^{(3)}$ whose weight coefficient is updated based on the delta $\delta_n^{(3)}$ in the back propagation, and is an input of the intermediate layer $z^{(2)}$ in the back propagation. The differentiation $\partial W_n^{(2)}$ is the differentiation with respect to coefficients of the intermediate layer $z^{(2)}$ of the loss function (formula (25)) and is calculated using the input to the intermediate layer $z^{(2)}$ in the forward propagation, that is, the output of the input layer $z^{(1)}$ in the forward propagation, and the delta $\delta_n^{(2)}$. The differentiation $\partial b_n^{(2)}$ is the differentiation with respect to the bias $b_n^{(2)}$ of the intermediate layer $z^{(2)}$ of the loss function and is the delta $\delta_n^{(2)}$.

$$\delta_n^{(2)} = f'(\mu_n^{(2)}) \cdot (\delta_n^{(3)} W^{(3)T}) \qquad \text{Formula (29)}$$

$$\partial W_n^{(2)} = z_n^{(1)T} \delta_n^{(2)} \qquad \text{Formula (30)}$$

$$\partial b_n^{(2)} = \delta_n^{(2)} \qquad \text{Formula (31)}$$

That is, the differentiation $\partial W_n^{(3)}$, the differentiation $\partial W_n^{(2)}$, the differentiation $\partial b_n^{(3)}$ and the differentiation $\partial b_n^{(2)}$ are represented as the following formulas (32), (33), (34), and (35), respectively.

$$\partial W_n^{(3)} = f(x_n W^{(2)} + b^{(2)})^T (y_n - d_n) K_n \qquad \text{Formula (32)}$$

$$\partial W_n^{(2)} = x_n^T (f'(x_n W^{(2)} + b^{(2)}) \cdot ((y_n - d_n) K_n W^{(3)^T})) \qquad \text{Formula (33)}$$

$$\partial b_n^{(3)} = (y_n - d_n) K_n \qquad \text{Formula (34)}$$

$$\partial b_n^{(2)} = f'(x_n W^{(2)} + b^{(2)}) \cdot ((y_n - d_n) K_n W^{(3)^T}) \qquad \text{Formula (35)}$$

In this way, the estimator 210 of the memory controller 200 according to the present embodiment estimates the actual read voltages by using the neural network 212 as a model (estimation function). The learner 220 sequentially updates the parameters of the estimator 210 using the set of learning data ($x_n$, $d_n$). Specifically, the learner 220 updates the parameters of the neural network 212 (model) of the estimator 210 using the back propagation method based on a difference ($y_n - d_n$). According to the configuration, the same effects as those of the above-described embodiments can be obtained. In addition, since the input data includes the word line WL number, that is, location information of the memory cell, inference can be made in consideration of a difference in characteristics for each position of the memory cell.

Fifth Embodiment

In the fourth embodiment, a flow when the set of learning data ($x_n$, $d_n$) is obtained for one word line WL related to any block at any time (acquisition time point) is illustrated; however, a fifth embodiment is not limited to such a configuration. The update operation (S109) of the learner 220 may be executed for each mini-batch.

For example, it is assumed that a loss function corresponding to N pieces of learning data shown in the following formula (36) is set in the same manner as in the fourth embodiment. The N pieces of learning data (a plurality of sets of learning data) are different from each other in at least one of time (acquisition time point) and a block related to any word line WL.

$$(x_1, d_1), (x_2, d_2), \ldots, (x_n, d_n), \ldots, (x_N, d_N) \qquad \text{Formula (36)}$$

The memory controller 200 calculates a differentiation for N pieces of learning data in the same manner as in the fourth embodiment. In addition, the memory controller 200 (the learner 220) updates the parameters of the estimator 210 using an average value of N differential values. The average value may be calculated sequentially, or may be calculated for each mini-batch. In this case, update formulas are represented by the following formulas (37) and (38).

$$W^{(l)} \leftarrow W^{(l)} - \frac{\epsilon}{N} \sum_{n=1}^{N} \partial W_n^{(l)} \quad (l = 2, 3) \qquad \text{Formula (37)}$$

$$b^{(l)} \leftarrow b^{(l)} - \frac{\epsilon}{N} \sum_{n=1}^{N} \partial b_n^{(l)} \quad (l = 2, 3) \qquad \text{Formula (36)}$$

According to the configuration, since the influence of the variation in the learning data can be reduced, it is possible to stabilize the update operation of the parameters of the estimator 210.

In the present embodiment, a combination with the fourth embodiment is illustrated; however, the present embodiment is not limited to such a configuration. In the update operation according to the first to third embodiments, any number of sets of learning data ($x_n$, $d_n$) (n=1, 2, ..., N) may be used for one update operation. Specifically, the learner 220 updates the parameters of the coefficient matrix 211 (model) of the estimator 210 using an average value of update amounts obtained using the plurality of sets of learning data in the same manner as described above. According to the configuration, the update operation according to the first to third embodiments can be stabilized.

Sixth Embodiment

In the update operation (S109) according to the fourth embodiment and the fifth embodiment, an update of the parameters of the neural network 212 may be different for each layer, or only one layer may be different from other layers in a plurality of layers. Therefore, a value of the coefficient ε can also be adjusted for each layer. A layer in which the value of the coefficient ε is adjusted may be different for each update or may be fixed. According to such a configuration, convergence of the parameters of the estimator 210 in the update operation can be improved, and the time required for the convergence can be reduced.

Seventh Embodiment

Further, in the update operation (S109) according to the fourth to sixth embodiments, the parameters of the neural network 212 may be updated only in a part of layers. In other words, the learner 220 updates the parameters of at least one of the plurality of layers in the neural network 212. For example, for a layer for which the parameters are not to be updated, the value of the coefficient ε is set to 0 (zero). In the embodiments described above, since the input layer $z^{(1)}$ that directly outputs input data is illustrated, the at least one layer to be updated does not include the input layer $z^{(1)}$. In other words, the layer to be updated is a layer for which at least one of the plurality of layers of the neural network 212 has a weighting coefficient set. The layer for which the parameters are to be updated may be different or fixed for each update. According to the configuration, the convergence of the parameters of the estimator 210 in the update operation can be improved, and the time required for the convergence can be reduced.

Eighth Embodiment

In the update operation (S109) according to each of the above-described embodiments, the parameters of the estimator 210 before the update may be stored. Specifically, the memory controller 200 may implement an estimator whose parameters are not to be updated and an estimator whose parameters are to be updated as the estimator 210.

For example, the memory controller 200 executes the processes of S101 to S109 in FIG. 9 by using the estimator whose parameters are not to be updated. When decoding in the soft decision read (S107) fails (S108: No), the memory controller 200 executes the processes of S101 to S109 in FIG. 9 using the estimator whose parameters are to be updated. Thereafter, when the decoding in the soft decision read (S107) is successful (S108: Yes), the memory controller 200 executes the update operation (S109) for the estimator whose parameters are to be updated.

The order in which the estimator whose parameters are not to be updated and the estimator whose parameters are to be updated are used is not limited to this manner. When the decoding in the soft decision read (S107) in the processes of S101 to S109 using the estimator whose parameters are to be updated fails (S108: No), the processes of S101 to S109 using the estimator whose parameters are not to be updated may be executed.

According to the configuration, while ensuring performance of the estimator 210 during offline learning, the parameters of the estimator 210 can be sequentially updated according to an actual environment by online learning.

Ninth Embodiment

In each of the above-described embodiments, the update operation (S109) may be executed for each class in which an erase unit and a write unit of each chip are classified according to quality. That is, the estimator 210 according to the present embodiment includes a plurality of estimators whose parameters are determined (learned) for each class classified by the quality.

The memory controller 200 selects the estimator 210 used for estimation for each class and then executes the estimation operation (S104). The learner 220 of the memory controller 200 executes the update operation (S109) related to each estimator 210 for each class.

Here, the quality relates to various factors that may change threshold voltages of the memory cell. The threshold voltage of a memory cell may change due to, for example, an access to the memory cell, the elapsed time and temperature history from completion of the program to the memory cell, an access to a memory cell adjacent to the memory cell, and an amount of wear of the memory cell. That is, the quality is, for example, the number of times a program/erase cycle is executed. Accordingly, it is possible to perform estimation considering the change in the threshold voltages due to the number of times the program/erase cycle is executed. Further, for another example, the quality is the number of times the read is executed. Accordingly, it is possible to perform estimation considering read disturbance. Further, the quality is, for another example, an actual use status and a stress condition of the memory system 1 such as an elapsed time since the program is executed, read latency, and temperature. Accordingly, it is possible to perform estimation considering the actual environment. Various kinds of information indicating these qualities are recorded in the management information 207 for each predetermined unit region such as the block BLK. The unit region is not limited to the block BLK. The unit region may be a word line WL, a page, or the like.

Techniques according to the embodiments described above can be freely selected to combine.

For example, when the eighth embodiment and the ninth embodiment are combined, the estimator that updates the parameters of the estimator 210 according to the eighth embodiment has a plurality of estimators for each class classified by quality. In addition, the processes of S101 to S109 in FIG. 9 may be performed on at least two of the plurality of estimators for each class classified by quality.

For example, when at least one of the fourth to eighth embodiments is combined with the ninth embodiment, information for specifying the class classified by the quality may be included in the input data to the neural network 212. In this case, at least one parameter of the model (estimator 210) is stored as the model information 206.

The learner 220 according to each of the above-described embodiments may be implemented by an independent learning device. That is, the function of the learner 220 may be implemented by, for example, a computer external to the memory controller 200 such as the host 2. The function of the learner 220 can also be implemented by a dedicated hardware circuit provided outside the memory controller 200.

According to at least one embodiment described above, the accuracy of the estimation of the read voltages can be improved.

While certain embodiments have been described, these embodiments have been presented by way of example only, and are not intended to limit the scope of the disclosures. Indeed, the novel embodiments described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A memory system, comprising:
 a non-volatile memory having a plurality of memory cells; and
 a memory controller configured to:
  generate a histogram indicating, with respect to each of a plurality of threshold voltage levels for multi-level cell (MLC) reading, a number of memory cells at the threshold voltage level, based on data read from the plurality of memory cells using a plurality of reference read voltages;
  estimate a plurality of read voltages for MLC reading of the plurality of memory cells as estimation values by inputting the histogram into a read voltage estimation model;
  determine, through MLC reading of the plurality of memory cells using a plurality of sets of read voltages, a set of read voltages for MLC reading as observation values; and
  update one or more parameters of the read voltage estimation model based on the estimation values and the observation values of read voltages.

2. The memory system according to claim 1, wherein the memory controller is further configured to:
 perform decoding of read data obtained through the reading of the plurality of memory cells using the plurality of sets of read voltages; and
 determine the set of read voltages for MLC reading as the observation values based on a decoding result of the decoding.

3. The memory system according to claim 2, wherein the memory controller determines a set of read voltages for MLC reading that results in a least number of error bits in the read data as the observation values of read voltages.

4. The memory system according to claim 1, wherein the memory controller is further configured to:
 obtain read data through MLC reading of the plurality of memory cells using the estimation values of read voltages;
 perform decoding of the read data; and
 determine the observation values of read voltages when the decoding of the read data fails.

5. The memory system according to claim 1, wherein the memory controller is further configured to:
 obtain read data through MLC reading of the plurality of memory cells using the estimation values of read voltages;

perform decoding of the read data; and
determine the observation values of read voltages when the decoding of the read data is successful and a number of collected bits in the decoding is greater than a predetermined threshold.

6. The memory system according to claim 1, wherein the memory controller updates the one or more parameters of the read voltage estimation model based on a squared error of differences between the estimation values and the observation values of read voltages.

7. The memory system according to claim 6, wherein
the read voltage estimation model includes a coefficient matrix indicating a relationship between the histogram and the observation values, and
the memory controller updates the one or more parameters of the read voltage estimation model by performing regularization of the coefficient matrix.

8. The memory system according to claim 1, wherein
the read voltage estimation model includes a neural network in which the one or more parameters are learned so as to output the estimation values in response to an input of the histogram, and
the memory controller updates the one or more parameters of the read voltage estimation model using a back propagation method based on differences between the estimation values and the observation values.

9. The memory system according to claim 1, wherein the memory controller updates the parameter of the read voltage estimation model by performing weighting according to the number of bit errors corresponding to each read voltage when the data stored in the plurality of memory cells is read.

10. The memory system according to claim 1, wherein the memory controller updates a parameter of the read voltage estimation model by using an average value of a plurality of update amounts of the parameter.

11. The memory system according to claim 1, wherein the memory controller stores at least one of a parameter of the read voltage estimation model before the update and the parameter of the read voltage estimation model after the update.

12. The memory system according to claim 11, wherein the memory controller stores the parameter of the read voltage estimation model with respect to each of a plurality of predetermined unit regions of the plurality of memory cells.

13. A method for controlling a memory system including non-volatile memory cells, the method comprising:
generating a histogram indicating, with respect to each of a plurality of threshold voltage levels for multi-level cell (MLC) reading, a number of memory cells at the threshold voltage level, based on data read from a plurality of memory cells using a plurality of reference read voltages;
estimating a plurality of read voltages for MLC reading of the plurality of memory cells as estimation values by inputting the histogram into a read voltage estimation model;
determining, through MLC reading of the plurality of memory cells using a plurality of sets of read voltages, a set of read voltages for MLC reading as observation values; and
updating one or more parameters of the read voltage estimation model based on the estimation values and the observation values of read voltages.

14. The method according to claim 13, further comprising:
performing decoding of read data obtained through the reading of the plurality of memory cells using the plurality of sets of read voltages, wherein
the set of read voltages for MLC reading is determined as the observation values based on a decoding result of the decoding.

15. The method according to claim 14, wherein a set of read voltages for MLC reading that results in a least number of error bits in the read data is determined as the observation values of read voltages.

16. The method according to claim 13, further comprising:
obtaining read data through MLC reading of the plurality of memory cells using the estimation values of read voltages; and
performing decoding of the read data, wherein
the observation values of read voltages are determined when the decoding of the read data fails.

17. The method according to claim 13, further comprising:
obtaining read data through MLC reading of the plurality of memory cells using the estimation values of read voltages; and
performing decoding of the read data, wherein
the observation values of read voltages are determined when the decoding of the read data is successful and a number of collected bits in the decoding is greater than a predetermined threshold.

18. The method according to claim 13, wherein the one or more parameters of the read voltage estimation model are updated based on a squared error of differences between the estimation values and the observation values of read voltages.

19. The method according to claim 18, wherein
the read voltage estimation model includes a coefficient matrix indicating a relationship between the histogram and the observation values, and
the one or more parameters of the read voltage estimation model are updated by performing regularization of the coefficient matrix.

20. The method according to claim 13, wherein
the read voltage estimation model includes a neural network in which the one or more parameters are learned so as to output the estimation values in response to an input of the histogram, and
the one or more parameters of the read voltage estimation model are updated using a back propagation method based on differences between the estimation values and the observation values.

* * * * *